(12) United States Patent
Kanzawa et al.

(10) Patent No.: US 8,445,319 B2
(45) Date of Patent: *May 21, 2013

(54) NONVOLATILE MEMORY ELEMENT, MANUFACTURING METHOD THEREOF, AND NONVOLATILE SEMICONDUCTOR APPARATUS USING THE NONVOLATILE MEMORY ELEMENT

(75) Inventors: Yoshihiko Kanzawa, Osaka (JP); Koji Katayama, Nara (JP); Satoru Fujii, Osaka (JP); Shunsaku Muraoka, Osaka (JP); Koichi Osano, Osaka (JP); Satoru Mitani, Osaka (JP); Ryoko Miyanaga, Nara (JP); Takeshi Takagi, Kyoto (JP); Kazuhiko Shimakawa, Osaka (JP)

(73) Assignee: Panasonic Corporation, Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/205,408

(22) Filed: Aug. 8, 2011

(65) Prior Publication Data
US 2011/0294259 A1 Dec. 1, 2011

Related U.S. Application Data

(63) Continuation of application No. 12/307,211, filed as application No. PCT/JP2008/000745 on Mar. 26, 2008, now Pat. No. 8,022,502.

(30) Foreign Application Priority Data

Jun. 5, 2007 (JP) ................................. 2007-149032

(51) Int. Cl.
*H01L 47/00* (2006.01)

(52) U.S. Cl.
USPC ........ 438/104; 438/141; 257/2; 257/E47.001; 257/E27.002; 257/E45.002; 257/E45.003

(58) Field of Classification Search
USPC ............................................................ 257/2
See application file for complete search history.

(56) References Cited

U.S. PATENT DOCUMENTS

| 6,473,332 | B1 | 10/2002 | Ignatiev et al. |
| 7,863,087 | B1 * | 1/2011 | Kumar et al. ................. 438/104 |
| 2004/0159867 | A1 | 8/2004 | Kinney et al. |

FOREIGN PATENT DOCUMENTS

| JP | 07-263647 | 10/1995 |
| JP | 2004-349689 | 12/2004 |

(Continued)

OTHER PUBLICATIONS

Baek, I.G., et al., "Highly Scalable Non-volatile Resistive Memory using Simple Binary Oxide Driven by Asymmetric Unipolar Voltage Pulses", Tech. Digest IEDM, 2004, IEEE.

(Continued)

*Primary Examiner* — Jerome Jackson, Jr.
(74) *Attorney, Agent, or Firm* — McDermott Will & Emery LLP

(57) ABSTRACT

A nonvolatile memory element comprises a first electrode layer (103), a second electrode (107), and a resistance variable layer (106) which is disposed between the first electrode layer (103) and the second electrode layer (107), a resistance value of the resistance variable layer varying reversibly according to electric signals having different polarities which are applied between the electrodes (103), (107), wherein the resistance variable layer (106) has a first region comprising a first oxygen-deficient tantalum oxide having a composition represented by TaOx ($0<x<2.5$) and a second region comprising a second oxygen-deficient tantalum oxide having a composition represented by TaOy ($x<y<2.5$), the first region and the second region being arranged in a thickness direction of the resistance variable layer.

4 Claims, 32 Drawing Sheets

FOREIGN PATENT DOCUMENTS

| | | |
|---|---|---|
| JP | 2004-363604 | 12/2004 |
| JP | 2005-317976 | 11/2005 |
| JP | 2006-040946 | 2/2006 |
| JP | 2007-180202 | 7/2007 |
| KR | 10-2006-0083368 | 7/2006 |
| WO | WO 00/49659 | 8/2000 |
| WO | WO 2006/077747 A1 | 7/2006 |
| WO | WO 2006/115208 A1 | 11/2006 |
| WO | WO 2007/013174 A1 | 2/2007 |
| WO | WO 2007/138646 A1 | 12/2007 |
| WO | WO 2008/059701 A1 | 5/2008 |
| WO | WO 2008/140979 A1 | 11/2008 |

OTHER PUBLICATIONS

Fujimoto, M., et al., "High-Speed Resistive Switching of $TiO_2$/TiN Nano-Crystalline Thin Film", Japanese Journal of Applied PHysics, 2006, L310-L312, vol. 45 No. 11.

Extended European Search Report issued in European Patent Application No. EP 08 72 0624.9 dated Nov. 17, 2009.

Brief Communication from European Patent Office, issued in European Patent Application No. 08720624.9, dated Mar. 30, 2010.

\* cited by examiner (a)

(b)

(c)

NONVOLATILE MEMORY ELEMENT, MANUFACTURING METHOD THEREOF, AND NONVOLATILE SEMICONDUCTOR APPARATUS USING THE NONVOLATILE MEMORY ELEMENT

RELATED APPLICATIONS

This application is a Continuation application of U.S. patent application Ser. No. 12/307,211, filed on Mar. 10, 2009, now U.S. Pat. No. 8,022,502 which is the U.S. National Phase under 35 U.S.C. §371 of International Application No. PCT/JP2008/000745, filed on Mar. 26, 2008, which in turn claims the benefit of Japanese Application No. 2007-149032, filed on Jun. 5, 2007, the disclosures of which Applications are incorporated by reference herein.

TECHNICAL FIELD

The present invention relates to a nonvolatile memory element. More particularly, the present invention relates to a resistance variable nonvolatile memory element whose resistance value varies according to an applied electric signal, a manufacturing method thereof, and a nonvolatile semiconductor apparatus using the nonvolatile memory element.

BACKGROUND ART

In recent years, with the advancement of digital technologies, higher functionality of electronic hardware such as portable information devices and information appliances have been provided. Therefore, demands for an increase in a capacity of a nonvolatile memory element, reduction in a writing power in the memory element, reduction in write/readout time of the memory element, and longer life of the memory element have been increasing.

It is said that, in response to these demands, miniaturization of an existing flash memory using a floating gate has a limitation. Accordingly, a novel resistance variable nonvolatile memory element using a resistance variable layer as a component of a memory portion has recently attracted attention.

This resistance variable nonvolatile memory element has fundamentally a very simple structure in which a resistance variable layer 504 is sandwiched between a lower electrode 503 and an upper electrode 505 as shown in FIG. 32. The resistance varies to a high-resistance state or a low-resistance state by only applying a predetermined electric pulse between the upper and lower electrodes. And, these different resistance states are made to correspond to numerical values to perform storing of data. Because of such simplicities in structure and operation, the resistance variable nonvolatile memory element is expected to attain further miniaturization and cost reduction. Furthermore, since there are some cases where the state transition between the high resistance and the low resistance occurs in order of 100 ns or less, the resistance variable nonvolatile memory element has attracted attention from the viewpoint of a high-speed operation, and therefore a variety of proposals thereof have been made.

For example, as disclosed in Patent Document 1, there is a resistance variable nonvolatile memory element in which metal ions are taken in and out of the resistance variable layer 504 by application of a voltage to the upper electrode and to the lower electrode, to produce a high-resistance state and a low-resistance state, to thereby store data. Further, as disclosed in Patent Document 2, a resistance variable memory (phase change memory) which changes a crystalline state of a resistance variable layer with an electric pulse to change the resistance state has also been known.

In addition to the above, there have been many proposals relating to a resistance variable nonvolatile memory element using a metal oxide for the resistance variable layer 504.

The resistance variable memory element using a metal oxide is roughly classified into two types depending on the material used for the resistance variable layer. One is a resistance variable nonvolatile memory element using, as a resistance variable layer, a perovskite material ($Pr_{(1-x)}Ca_xMnO_3$ (PCMO), $LaSrMnO_3$ (LSMO), $GdBaCo_xO_y$ (GBCO)) which is disclosed in Patent Document 3 etc.

The other is a resistance variable nonvolatile memory element using a binary transition metal oxide. Since the binary transition metal oxide is very simple in composition and structure as compared to the above identified perovskite material, composition control therefor and film formation using them during manufacturing are relatively easy. In addition, the binary transition metal oxide has an advantage that its compatibility with a semiconductor manufacturing process is relatively favorable. Therefore, the binary transition metal oxide has been intensely studied in recent years. For example, Patent Document 4 and Non-patent Document 1 disclose NiO, $V_2O_5$, ZnO, $Nb_2O_5$, $TiO_2$, $WO_3$, and CoO as resistance variable materials. Further, Patent Document 5 discloses a resistance variable nonvolatile memory element using, as a variable-resistance material, a suboxide (oxide deviating from stoichiometric composition) of Ni, Ti, Hf, Nb, Zn, W, or Co, etc. Further, Patent Document 6 and Non-patent Document 2 disclose examples where a structure obtained by oxidizing the surface of TiN to form a $TiO_2$ crystalline film in nm order is used for the resistance variable layer.

In addition to the above, Patent Document 7 discloses a so-called one time programmable memory which uses titanium oxide and tantalum oxide ($Ta_2O_5$) as resistance variable materials and is capable of writing only once.

Patent Document 1: Japanese Laid-Open Patent Application Publication No. 2006-40946

Patent Document 2: Japanese Laid-Open Patent Application Publication No. 2004-349689

Patent Document 3: U.S. Pat. No. 6,473,332

Patent Document 4: Japanese Laid-Open Patent Application Publication No. 2004-363604

Patent Document 5: Japanese Laid-Open Patent Application Publication No. 2005-317976

Patent Document 6: Japanese Laid-Open Patent Application Publication No. 2007-180202

Patent Document 7: Japanese Laid-Open Patent Application Publication No. Hei. 7-263647

Non-patent Document 1: I. G. Beak et al., Tech. Digest IEDM 2004, p 587

Non-patent Document 2: Japanese Journal of Applied Physics Vol. 45, No. 11, 2006, pp. L3 10-L312

DISCLOSURE OF THE INVENTION

Problems to be Solved by the Invention

However, the nonvolatile memory elements using the above described transition metal oxides for the resistance variable layers have the following problems.

First, in the conventional resistance variable nonvolatile memory element using the transition metal oxide such as NiO, the resistance variable material can be changed from the high-resistance state to the low-resistance state by a short electric pulse of about 100 ns, as disclosed in Non-patent Document 1. However, since a long pulse in μs order is required for the resistance variable material to change from the low-resistance state to the high-resistance state, it is difficult to achieve high speed. Further, the resistance state does not change immediately after the structure having the variable resistance material sandwiched between the upper and lower electrodes is formed. That is, it is said that, in order to cause a change in the resistance state, a process of warming-up (hereinafter referred to as a forming process) which applies a special electric impulse between the upper and lower electrodes is required. Considering mass production of resistance variable memories, such forming process is far from desirable. This is because the forming process can be regarded as one manufacturing step, leading to increased cost and complicated manufacturing processes.

As defined herein, the forming process is a process for changing the state of the resistance variable nonvolatile memory element immediately after being manufactured, by applying an electric pulse having a magnitude (voltage value) and a width (time) different from those of an electric pulse which enables steady change in the resistance state to take place. For example, supposing a case where, in order to operate a nonvolatile memory element having a potential capability of changing its resistance state with an electric pulse having a voltage of 2V and a width of 100 ns, an electric pulse different from this electric pulse must be applied to the nonvolatile memory element immediately after being manufactured (e.g., application of electric pulse of 3V and 1 µs ten times), this is expressed that the forming process is required.

On the other hand, it is said that in the resistance variable memory having the structure obtained by oxidizing the surface of TiN to form microcrystalline $TiO_2$ ($TiO_2$/TiN structure) which is disclosed in Patent Document 6 and Non-patent Document 2, the forming process is dispensed with. It is said that in this memory, however, the $TiO_2$ forms an aggregate of nanometer-order microcrystal (hereinafter referred to as nanocrystal), and the state of resistance variations depending on the size of this crystal. Generally, the size and crystalline structure of the nanocrystal are highly sensitive to the manufacturing method (it is formed by oxidation in the above), which may lead to significant variations in manufacturing. That is, it is not desirable to use the nanocrystal for the resistance variable layer because the nanocrystal tends to cause variations in the state of resistance variation.

Furthermore, in a case where the transition metal oxide made of $Ta_2O_5$ which is disclosed in Patent Document 7 is used as a major component, it serves as an anti-fuse which can be used for only one operation from the high-resistance state to the low-resistance state, and therefore, rewriting cannot be performed. That is, since the resistance state is changed by insulation breakdown of the transition metal oxide in this case, the transition metal oxide which has once been changed to the low-resistance state cannot be restored to the high-resistance state.

The present invention is made in view of the circumstances, and an object of the present invention is to provide a nonvolatile memory element which operates without a need for a forming process, and has high-speed and reversibly-stable rewrite characteristics and desirable resistance value retention characteristics, a manufacturing method of the nonvolatile memory element, which has high affinity with a semiconductor manufacturing process, and a nonvolatile semiconductor apparatus using the nonvolatile memory element.

Means for Solving the Problems

With a view to achieving the above described objective, a nonvolatile memory element comprises a first electrode; a second electrode; and a resistance variable layer which is disposed between the first electrode and the second electrode, a resistance value of the resistance variable layer varying reversibly according to electric signals having different polarities which are applied between the electrodes; wherein the resistance variable layer has a first region comprising a first oxygen-deficient tantalum oxide having a composition represented by TaOx ($0<x<2.5$) and a second region comprising a second oxygen-deficient tantalum oxide having a composition represented by TaOy ($x<y<2.5$), the first region and the second region being arranged in a thickness direction of the resistance variable layer.

The resistance variable layer may have a layered structure in which at least two layers of a first oxygen-deficient tantalum oxide layer having a composition represented by TaOx ($0<x<2.5$) and a second oxygen-deficient tantalum oxide layer having a composition represented by TaOy ($x<y<2.5$) are stacked, and the first oxygen-deficient tantalum oxide layer being the first region and the second oxygen-deficient tantalum oxide layer being the second region.

The second oxygen-deficient tantalum oxide layer may be in contact with the first electrode or the second electrode.

When a resistance value between the first electrode and the second electrode after application of an electric pulse having an electric potential higher than an electric potential of the electrode with which the second oxygen-deficient tantalum oxide layer is not in contact to the electrode with which the second oxygen-deficient tantalum oxide layer is in contact is $R_H$, and a resistance value between the first electrode and the second electrode after application of an electric pulse having an electric potential lower than an electric potential of the electrode with which the second oxygen-deficient tantalum oxide layer is not in contact to the electrode with which the second oxygen-deficient tantalum oxide layer is in contact is $R_L$, $R_H>R_L$ may be satisfied.

It is preferable that the TaOx satisfies $0.8 \leq x \leq 1.9$.
It is preferable that the TaOy satisfies $2.1 \leq y < 2.5$.
It is preferable that the second oxygen-deficient tantalum oxide layer has a thickness smaller than a thickness of the first oxygen-deficient tantalum oxide layer.

It is preferable that the second oxygen-deficient tantalum oxide layer has a thickness that is not smaller than 1 nm and not larger than 8 nm.

A nonvolatile semiconductor apparatus of the present invention comprises a semiconductor substrate: and a memory array including; a plurality of first electrode wires formed on the semiconductor substrate to extend in parallel with each other; a plurality of second electrode wires formed above the plurality of first electrode wires so as to extend in parallel with each other within a plane parallel to a main surface of the semiconductor substrate and so as to three-dimensionally cross the plurality of first electrode wires; and nonvolatile memory elements provided to respectively correspond to three-dimensional cross points of the plurality of first electrode wires and the plurality of second electrode wires; wherein each of the nonvolatile memory elements includes, when the first electrode wire is a first electrode and the second electrode wire is a second electrode, a resistance variable layer disposed between the first electrode and the second electrode, a resistance value of the resistance variable layer varying reversibly according to a voltage applied between the first electrode and the second electrode; and wherein the resistance variable layer has a first region comprising a first oxygen-deficient tantalum oxide having a composition represented by TaOx ($0<x<2.5$) and a second region comprising a second oxygen-deficient tantalum oxide having a composition represented by TaOy ($x<y<2.5$), the first region and the second region being arranged in a thickness direction of the resistance variable layer.

A nonvolatile semiconductor apparatus of the present invention comprises a semiconductor substrate: and a memory array including; a plurality of first electrode wires formed on the semiconductor substrate to extend in parallel with each other; a plurality of second electrode wires formed above the plurality of first electrode wires so as to extend in parallel with each other within a plane parallel to a main surface of the semiconductor substrate and so as to three-dimensionally cross the plurality of first electrode wires; and nonvolatile memory elements provided to respectively correspond to three-dimensional cross points of the plurality of first electrode wires and the plurality of second electrode wires; wherein each of the nonvolatile memory elements includes a first electrode connected to the first electrode wire, a second electrode connected to the second electrode wire, and a resistance variable layer disposed between the first electrode and the second electrode, a resistance value of the resistance variable layer varying reversibly according to a voltage applied between the first electrode and the second electrode; and wherein the resistance variable layer has a first region comprising a first oxygen-deficient tantalum oxide having a composition represented by TaOx ($0<x<2.5$) and a second region comprising a second oxygen-deficient tantalum oxide having a composition represented by TaOy ($x<y<2.5$), the first region and the second region being arranged in a thickness direction of the resistance variable layer.

Each of the nonvolatile memory elements may includes a current restricting element between the first electrode and the second electrode, and the current restricting element is electrically connected to the resistance variable layer.

The nonvolatile semiconductor apparatus may further comprise a multi-layer memory array including a plurality of memory arrays which are stacked to form a layered structure.

A nonvolatile semiconductor apparatus of the present invention comprises a semiconductor substrate; a plurality of word lines and a plurality of bit lines which are formed on the semiconductor substrate and are arranged to cross each other; a plurality of transistors provided to respectively correspond to intersections of the plurality of word lines and the plurality of bit lines; and a plurality of nonvolatile memory elements provided to respectively correspond to the plurality of transistors; wherein each of the nonvolatile memory elements includes a first electrode, a second electrode, and a resistance variable layer disposed between the first electrode and the second electrode, a resistance value of the resistance variable layer varying reversibly according to an electric signal applied between the first electrode and the second electrode via an associated one of the transistors; and wherein the resistance variable layer has a first region comprising a first oxygen-deficient tantalum oxide having a composition represented by TaOx ($0<x<2.5$) and a second region comprising a second oxygen-deficient tantalum oxide having a composition represented by TaOy ($x<y<2.5$), the first region and the second region being arranged in a thickness direction of the resistance variable layer.

A nonvolatile semiconductor apparatus of the present invention comprises a semiconductor substrate; a logic circuit formed on the semiconductor substrate and configured to execute predetermined calculation; and a nonvolatile memory element formed on the semiconductor substrate and having a programming function; wherein the nonvolatile memory element includes a first electrode, a second electrode, and a resistance variable layer disposed between the first electrode and the second electrode, a resistance value of the resistance variable layer varying reversibly according to a voltage applied between the electrodes; and wherein the resistance variable layer has a first region comprising a first oxygen-deficient tantalum oxide having a composition represented by TaOx ($0<x<2.5$) and a second region comprising a second oxygen-deficient tantalum oxide having a composition represented by TaOy ($x<y<2.5$), the first region and the second region being arranged in a thickness direction of the resistance variable layer.

The nonvolatile semiconductor apparatus may further comprise another specific nonvolatile semiconductor apparatus.

A method of manufacturing a nonvolatile memory element of the present invention including a first electrode; a second electrode; and a resistance variable layer which is disposed between the first electrode and the second electrode, a resistance value of the resistance variable layer varying reversibly according to electric signals having different polarities which are applied between the electrodes, said method comprising a step of manufacturing the resistance variable layer including (A) a step of forming a first region forming a part of the resistance variable layer in a thickness direction thereof and comprising a first oxygen-deficient tantalum oxide having a composition represented by TaOx ($0<x<2.5$) and (B) a step of forming a second region which is disposed adjacent the first region in the thickness direction of the resistance variable layer, and comprises a second oxygen-deficient tantalum oxide having a composition represented by TaOy ($x<y<2.5$).

The step A may be a step of forming a first layer comprising the first oxygen-deficient tantalum oxide, and the step B may be a step of oxidizing a surface of the first layer to form the first region and the second region. As used herein, the phrase "second region disposed adjacent the first region" means both of a configuration in which the first region and the second region are in contact with each other and a configuration in which another region exists between the first region and the second region.

The step A may be a step of forming a first layer which is the first region comprising the first oxygen-deficient tantalum oxide, and the step B may be a step of depositing on the first layer a second layer which is the second region comprising the second oxygen-deficient tantalum oxide.

The first layer may be formed by a sputtering process or a chemical vapor deposition process.

The second layer may be formed by a sputtering process or a chemical vapor deposition process.

The second layer may have a thickness that is not smaller than 1 nm and not larger than 8 nm.

Foregoing object, other object, features, and advantages of the present invention will be apparent from the following detailed description of the preferred embodiments with reference to accompanying drawings.

Effects of the Invention

According to the present invention, it is possible to attain a nonvolatile memory element which is capable of performing a high-speed operation and has reversibly-stable rewrite characteristics and desirable resistance value retention characteristics without a need for a finning process, a method of manufacturing the nonvolatile memory element, which has a high affinity with a semiconductor manufacturing process, and a nonvolatile semiconductor apparatus using the nonvolatile memory element.

Figure 1:
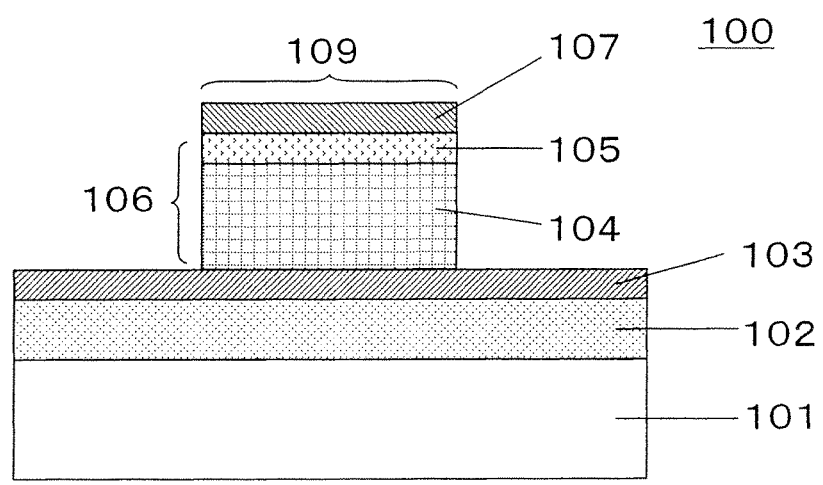
FIG. 1 is a cross-sectional view showing an example of a configuration of a nonvolatile memory element according to Embodiment 1 of the present invention.

| EXPLANATION OF REFERENCE NUMERALS | |
|---|---|
| 100 | nonvolatile memory element |
| 101 | substrate |
| 102 | oxide layer |
| 103 | first electrode layer |
| 104 | first tantalum oxide layer |
| 105 | second tantalum oxide layer |
| 106 | resistance variable layer |
| 107 | second electrode layer |
| 108 | photoresist |
| 109 | element region |
| 110 | third tantalum oxide layer |
| 200 | nonvolatile semiconductor apparatus |
| 201 | memory main body |
| 202 | memory array |

-continued

EXPLANATION OF REFERENCE NUMERALS

| | |
|---|---|
| 203 | row selection circuit/driver |
| 204 | column selection circuit/driver |
| 205 | write circuit |
| 206 | sense amplifier |
| 207 | data input/output circuit |
| 208 | address input circuit |
| 209 | control circuit |
| 210 | nonvolatile memory element |
| 211 | upper wire |
| 212 | lower wire |
| 213 | upper electrode |
| 214 | resistance variable layer |
| 215 | inner electrode |
| 216 | current restricting element |
| 217 | lower electrode |
| 218 | ohmic resistance layer |
| 219 | second resistance variable layer |
| 300 | nonvolatile semiconductor apparatus |
| 301 | memory main body |
| 302 | memory array |
| 303 | row selection circuit/driver |
| 304 | column selection circuit |
| 305 | write circuit |
| 306 | sense amplifier |
| 307 | data input/output circuit |
| 308 | cell plate electric power supply |
| 309 | address input circuit |
| 310 | control circuit |
| 313 | nonvolatile memory element |
| 314 | upper electrode |
| 315 | resistance variable layer |
| 316 | lower electrode |
| 400 | nonvolatile semiconductor apparatus |
| 401 | semiconductor substrate |
| 402 | CPU |
| 403 | input/output circuit |
| 404 | logic circuit |
| 405 | analog circuit |
| 406 | BIST circuit |
| 407 | SRAM |
| 408 | relief address storage register |
| 409 | nonvolatile memory element |
| 410 | write circuit |
| 411 | readout circuit |
| 412 | latch circuit |
| BL0, BL1, . . . | bit lines |
| M11, M12, . . . | memory cells |
| T11, T12, . . . | transistors |
| WL0, WL1, . . . | word lines |
| 500 | nonvolatile memory element |
| 501 | substrate |
| 502 | oxide layer |
| 503 | lower electrode |
| 504 | resistance variable layer |
| 505 | upper electrode |

BEST MODE FOR CARRYING OUT THE INVENTION

Hereinafter, preferred embodiments of the present invention will be described in detail with reference to the drawings. It should be noted that the same reference numerals are used to identify the same or corresponding parts throughout the drawings, and description thereof may be in some cases omitted.

(Embodiment 1)
[Configuration of Nonvolatile Memory Element]

FIG. 1 is a cross-sectional view showing an example of a configuration of a nonvolatile memory element according to Embodiment 1 of the present invention.

As shown in FIG. 1, a nonvolatile memory element 100 of this embodiment comprises a substrate 101, an oxide layer 102 formed on the substrate 101, a first electrode layer 103 formed on the oxide layer 102, a second electrode layer 107, and a resistance variable layer 106 sandwiched between the first electrode layer 103 and the second electrode layer 107. The resistance variable layer 106 comprises an oxygen-deficient tantalum oxide having a composition represented by $TaO_z$ ($0<z<2.5$). The resistance variable layer 106 comprises a first tantalum-containing layer (first region: hereinafter referred to as "first tantalum oxide layer") 104 having a low oxygen content rate, and a second tantalum-containing layer (second region: hereinafter referred to as "second tantalum oxide layer) 105 formed on the first tantalum oxide layer 104, and having an oxygen content rate higher than that of the first tantalum oxide layer 104.

When driving this nonvolatile memory element 100, a voltage satisfying a predetermined condition is applied between the first electrode layer 103 and the second electrode layer 107 by an external electric power supply. As defined herein, a relative electric potential (voltage) of the second electrode layer 107 with respect to the first electrode layer 103 is defined as a voltage applied between the first electrode layer 103 and the second electrode layer 107. Accordingly, an applied voltage with which the electric potential of the second electrode layer 107 becomes higher than that of the first electrode layer 103 is a positive applied voltage, while an applied voltage with which the electric potential of the second electrode layer 107 becomes lower than that of the first electrode layer 103 is a negative applied voltage. According to the direction (polarity) of the voltage application, the resistance value of the resistance variable layer 106 of the nonvolatile memory element 100 reversibly increases or decreases. For example, when a pulse voltage higher than a predetermined threshold voltage is applied, the resistance value of the resistance variable layer 106 increases or decreases, whereas when a pulse voltage lower than the threshold voltage is applied, the resistance value of the resistance variable layer 106 does not vary.

As for the materials of the first electrode layer 103 and the second electrode layer 107, for example, Pt (platinum), Ir (iridium), Pd (palladium), Ag (silver), Ni (nickel), W (tungsten), Cu (copper), and TaN (tantalum nitride) may be used.

While a silicon single crystal substrate or a semiconductor substrate can be used as the substrate 101, the substrate 101 is not limited thereto. Since the resistance variable layer 106 can be formed at a relatively low substrate temperature, it may be formed on a resin material or the like.

[Method of Manufacturing Nonvolatile Memory Element]

Figure 2:
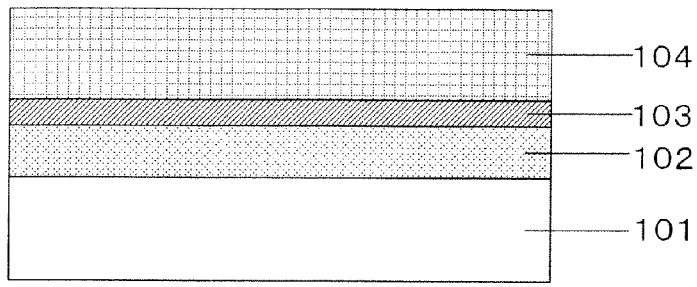
FIGS. 2(a) to 2(c) are cross-sectional views showing steps for manufacturing the nonvolatile memory element according to Embodiment 1 of the present invention.
Figure 2:
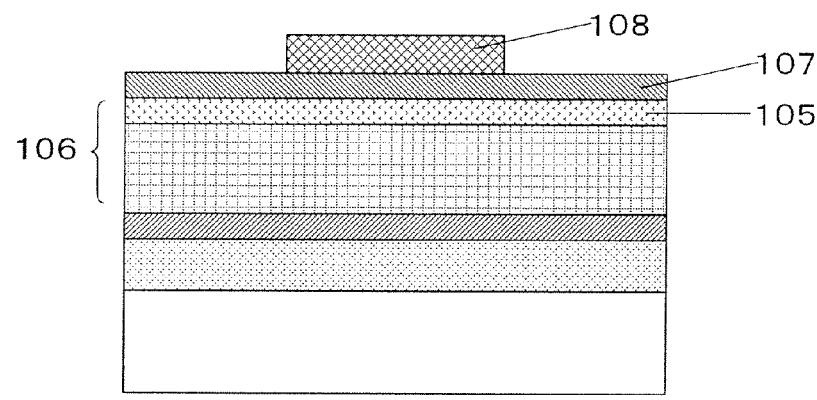
Figure 2:
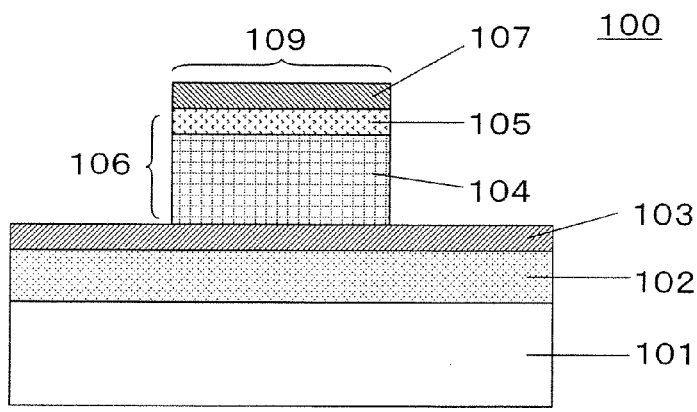

Subsequently, a method of manufacturing the nonvolatile memory element 100 of this embodiment will be described with reference to FIGS. 2(a) to 2(c).

Initially, as shown in FIG. 2(a), a 200 nm thick oxide layer 102 is formed on a single crystal silicon substrate 101 by a thermal oxidation process. Then, a 100 nm thick Pt thin film as a first electrode layer 103 is formed on the oxide layer 102 by a sputtering process. Thereafter, a first tantalum oxide layer (first layer) 104 is formed on the first electrode layer 103 by a reactive sputtering process using a Ta target.

Next, as shown in FIG. 2(b), the uppermost surface of the first tantalum oxide layer 104 is oxidized to reform the same. Thereby, a second tantalum oxide layer (second region) 105 whose oxygen content rate is higher than that of the first tantalum oxide layer 104 is formed on the surface of the first tantalum oxide layer 104. Thus, a resistance variable layer 106 consists of a layered structure comprising the first tantalum oxide layer 104 (to be precise, a non-oxidized region (first region) of the first layer) and the second tantalum oxide layer 105, which are stacked.

Thereafter, a 150 nm thick Pt thin film is formed as a second electrode layer 107 on the second tantalum oxide layer 105 by the sputtering process. Finally, a photoresist pattern 108 is formed by a photoresist process. Finally, as shown in FIG. 2(c), an element region 109 is formed by dry etching.

Examples 1 to 3 were manufactured according to the above described manufacturing method. Hereinafter, the details will be described.

Initially, in the manner described above, the layered structure comprising the substrate 101, the oxide layer 102, and the first electrode layer 103 made of Pt was formed. Then, the first tantalum oxide layer 104 was formed on the first electrode layer 103 by so-called reactive sputtering which involves sputtering a Ta target in a mixture of argon gas and oxygen gas. The film forming conditions in this case were such that the degree of vacuum (back pressure) inside a sputtering apparatus before the start of the sputtering was about $7 \times 10^{-4}$ Pa, the power during the sputtering was 250 W, the total gas pressure of the argon gas and oxygen gas was 3.3 Pa, the flow rate ratio of the oxygen gas was 3.4%, the set temperature of the substrate was 30° C., and the film forming time was 7 minutes. Thereby, the first tantalum oxide layer 104 having an oxygen content rate of about 58 at %, i.e., which can be represented by $TaO_{1.4}$, was deposited to have a thickness of 30 nm.

In the manufacturing of Examples 1 to 3, the formation of the first tantalum oxide layer 104 and the second tantalum oxide layer 105 and the formation of the second electrode layer 107 were continuously carried out inside the sputtering apparatus. To be specific, after the first tantalum oxide layer 104 was deposited, a shutter was inserted between the Ta target and the substrate 101 disposed opposite to the Ta target, while maintaining the sputtering condition such as the gas pressure condition and the power etc. This state was kept for a predetermined time. Thereby, the uppermost surface of the first tantalum oxide layer 104 was oxidized by oxygen plasma. As the result, the second tantalum oxide layer 105 having an oxygen content rate higher than that of the first tantalum oxide layer 104 was formed on the surface of the first tantalum oxide layer 104.

Thereafter, in the manner described above, the second electrode layer 107 made of Pt was formed on the second tantalum oxide layer 105.

Thereafter, the element region 109 was formed by a photoresist process. In Examples 1 to 3, the element region 109 was a circular pattern having a diameter of 3 μm.

In this embodiment, Examples 1 to 3 were manufactured in such a way that the treatment time of the oxidation using the oxygen plasma (oxygen plasma exposure time) was changed. The relation between the manufactured examples and the oxygen plasma exposure time is shown in Table 1. The fact that the oxygen plasma exposure time for Example 1 is 0 minute means that after the deposition of the first tantalum oxide layer 104, Pt was immediately deposited as the second electrode layer without exposing the first tantalum oxide layer 104 to oxygen plasma. Table 1 also shows the measurement result of the initial resistances of the respective elements which will be described later, in addition to the oxygen plasma exposure time.

TABLE 1

| | Example 1 | Example 2 | Example 3 |
|---|---|---|---|
| Oxygen plasma exposure time (min) | 0 | 0.5 | 1 |
| Initial resistance (Ω) | 11 | 650 | 1850 |

Hereinafter, the characteristics and the like of Examples 1 to 3 manufactured as described above will be described.

[Initial Resistance of Resistance Variable Layer]

First of all, the initial resistances of the resistance variable layers 106 of Examples 1 to 3 are measured, and the measurement results are studied. A weak voltage of 50 mV which is lower than a threshold voltage (e.g., about 1V) was applied between the first electrode layer 103 and the second electrode layer 107 in each example, and the resulting flowing current was measured to obtain the initial resistance value of the resistance variable layer 106 in each example. The result is shown in Table 1.

With reference to Table 1, the initial resistance value is 11Ω in Example 1 (oxygen plasma exposure time: 0 min), 650Ω in Example 2 (oxygen plasma exposure time 0.5 min), and 1890Ω in Example 3. It is found that the resistance value of the resistance variable layer 106 increases as the oxygen plasma exposure time increases.

On the other hand, the measurement result of the sheet resistivity of the first tantalum oxide layer ($TaO_{1.4}$) manufactured as in this embodiment, which was separately measured, was 4 to 5 mΩcm. It is considered that the sheet resistivity shows the resistivity inside the tantalum oxide, that is, the original resistivity inherent to the tantalum oxide. If only the tantalum oxide having the original resistivity is cut out in a shape having a film thickness of 30 nm and a diameter of 3 μm (the size of the element region in Examples 1 to 3), the resistance value thereof is about 0.2Ω. Compared with this, the resistance values of the resistance variable layers 106 of the respective examples shown in Table 1 are very high. It is considered that these differences are caused by the contact resistances between the first and second electrode layers 103 and 107 and the resistance variable layer 106, and the second tantalum oxide layer 105 formed by the oxygen plasma treatment. It is presumed that the resistance value of 11Ω observed in Example 1 whose oxygen plasma exposure time was 0 min corresponds to the contact resistance, and a large part of the high-resistance values higher than several hundreds Ω observed in Examples 2 and 3 are caused by the second tantalum oxide layer 105 formed by the oxygen plasma treatment.

[Example of Operation of Resistance Variable Nonvolatile Memory Element]

Before explaining the specific operations of Examples 1 to 3, an operation example of the resistance variable nonvolatile memory element manufactured in this embodiment, that is, an operation example which occurs when writing/reading out data, will be described with reference to the drawings.

Figure 3:
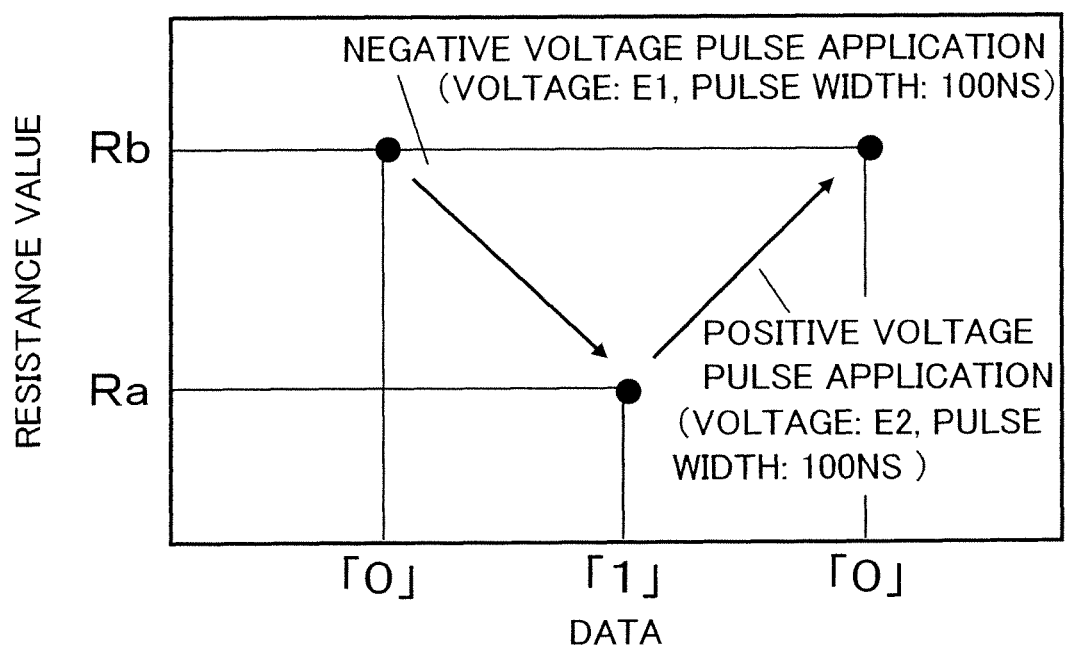
FIG. 3 is a view showing an example of operation of Examples 1 to 3 of the nonvolatile memory element according to Embodiment 1 of the present invention which occurs when reading out data.

FIG. 3 is a view showing the example of the operation of the resistance variable nonvolatile memory element which occurs when writing data.

When two kinds of electric pulses of different polarities, having a pulse width of 100 nsec, are alternately applied between the first electrode layer 103 and the second electrode layer 107 of the nonvolatile memory element shown in FIG. 1, the resistance value of the resistance variable layer 106 varies as shown in FIG. 3. To be specific, when a negative voltage pulse (voltage: E1, pulse width: 100 nsec) is applied between the electrodes, the resistance value of the resistance variable layer 106 decreases from a high-resistance value Rb to a low-resistance value Ra. On the other hand, when a positive voltage pulse (voltage: E2, pulse width: 100 nsec) is applied between the electrodes, the resistance value of the resistance variable layer 106 increases from the low-resistance value Ra to the high-resistance value Rb.

In the example shown in FIG. 3, the high-resistance value Rb is assigned to data "0" while the low-resistance value Ra is assigned to data "1". Therefore, the data "0" is written by applying the positive voltage pulse between the electrodes so that the resistance value of the resistance variable layer 106 becomes the high-resistance value Rb, while the data "1" is written by applying the negative voltage pulse between the electrodes so that the resistance value becomes the low-resistance value Ra.

Figure 4:
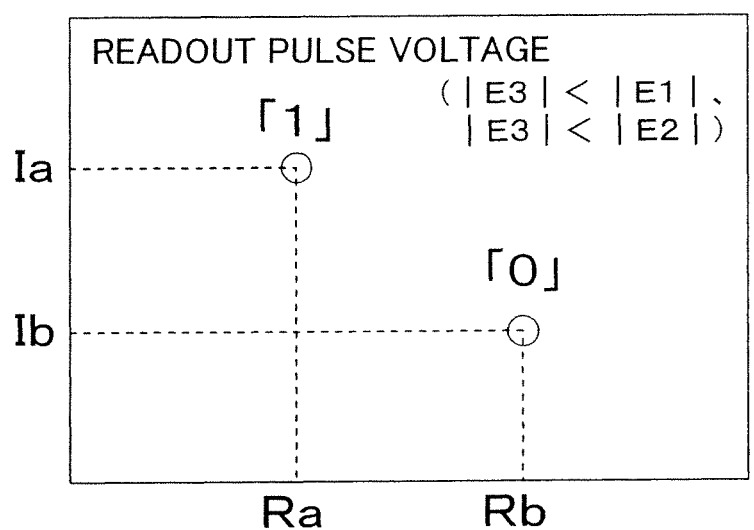
FIG. 4 is a view showing an example of operation of Examples 1 to 3 of the nonvolatile memory element according to Embodiment 1 of the present invention which occurs when writing data.

FIG. 4 is a view showing the example of the operation of Examples 1 to 3 which occurs when reading out data.

When reading out data, a readout voltage E3 having an amplitude smaller than those of the electric pulses applied to vary the resistance value of the resistance variable layer 106 (|E3|<|E1|, |E3|<|E2|) is applied between the electrodes. As the result, a current corresponding to the resistance value of the resistance variable layer 106 is output, and its output current value is detected, thereby reading out written data.

In the example shown in FIG. 4, since the output current value Ia and the output current value Ib correspond to the low-resistance value Ra and the high-resistance value Rb, respectively, the data "1" is read out when the output current value Ia is detected, while the data "0" is read out when the output current value Ib is detected.

[Resistance Varying Characteristics of Examples 1 to 3]

Next, a description will be made of the characteristics obtained when resistance variations are caused by applying the electric pulses to Examples 1 to 3 which are actually manufactured in this embodiment.

Figure 5:
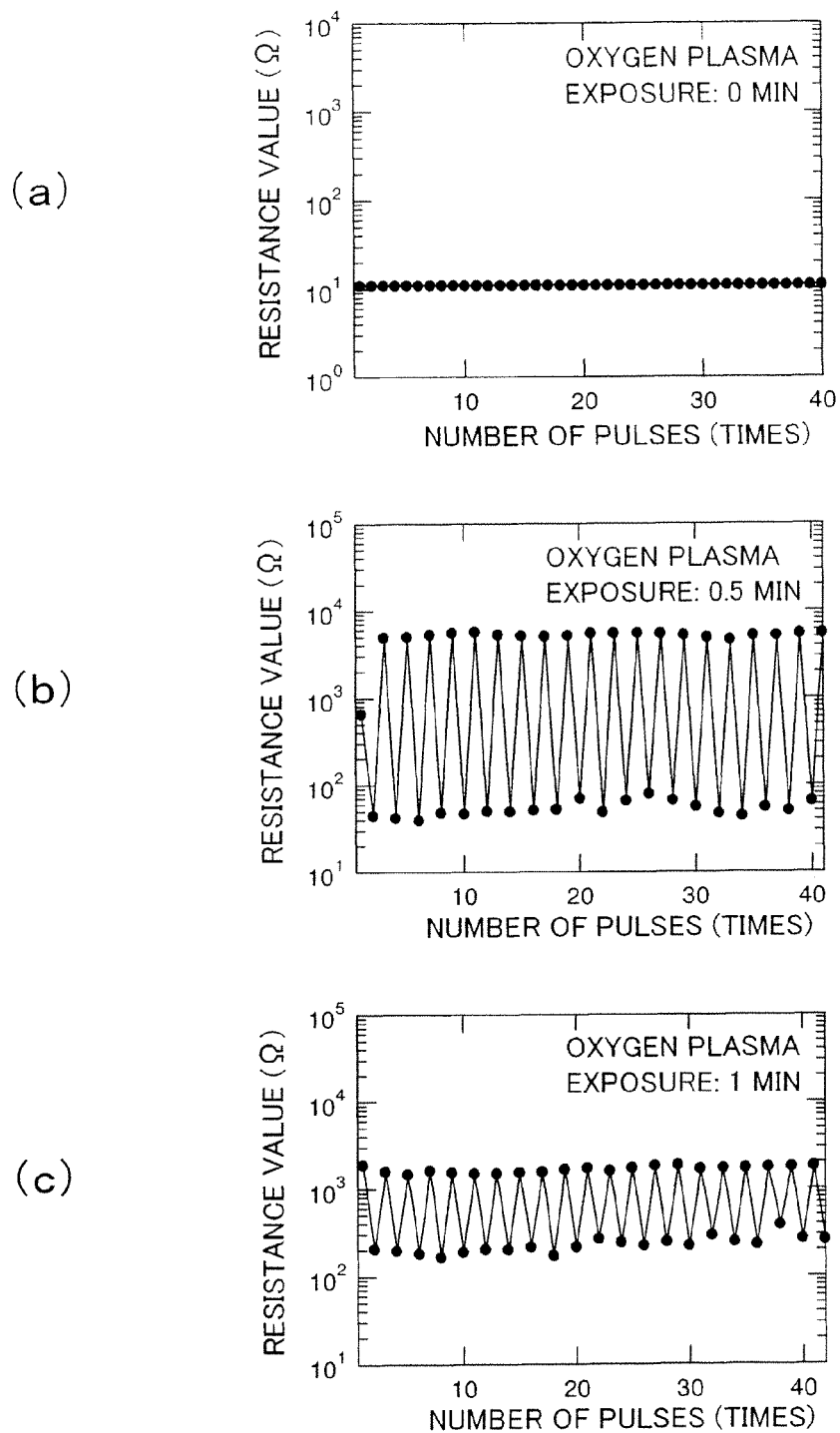
FIGS. 5(a) to 5(c) are views showing the relation between a resistance value of a resistance variable layer included in the nonvolatile memory element according to Embodiment 1 of the present invention, and the number of times of pulse applications.

FIG. 5 is a view showing the relation between the resistance value of the resistance variable layer included in the nonvolatile memory element according to Embodiment 1, and the applied electric pulse, wherein FIG. 5(a) to FIG. 5(c) show the results obtained in Examples 1 to 3, respectively. The resistance value of the resistance variable layer 106 was measured by applying two kinds of electric pulses, i.e., a negative voltage of −2.0V and a positive voltage of 3.0V each having a pulse width of 100 nsec, between the first electrode layer 103 and the second electrode layer 107, alternately and repeatedly. As already described, the applied voltage with which the electric potential of the second electrode layer 107 becomes higher than that of the first electrode layer 103 is the positive voltage, and the applied voltage with which the electric potential of the second electrode layer 107 becomes lower than that of the first electrode layer 103 is the negative voltage.

First, with reference to FIG. 5(b) which shows the resistance varying characteristic of Example 2 obtained by radiating oxygen plasma for 0.5 min, it can be seen that the resistance value decreases from 650Ω to about 50Ω by applying the electric pulse of negative voltage of −2.0V to the sample in the initial state immediately after measurement. Then, the resistance value increases to 5000Ω by applying the electric pulse of positive voltage of 3.0V, and thereafter, it is confirmed that highly-stable reversible resistance variations occur between 50Ω and 5000Ω. That is, from the beginning, stable resistance variations are observed without the forming process.

Further, as can be seen from FIG. 5(c), reversible resistance variation occurs with stability within the measurement range also in Example 3 obtained by radiating oxygen plasma for 1 min, and the resistance value decreases to about 200Ω by applying the electric pulse of −2V to the element whose initial resistance was 1890Ω, and the resistance value increases to 2000Ω by applying the electric pulse of +3V. Also in this case, stable resistance variation occurs without a need for the forming process.

However, with reference to FIG. 5(a) which shows the resistance varying characteristics of Example 1, it can be seen that the resistance variation does not occur even though the two kinds of electric pulses of −2.0V and 3.0V are applied. Since Example 1 is produced under the condition in which the oxygen plasma exposure time is 0 min, that is, by depositing the second electrode layer 107 immediately after deposition of the first tantalum oxide layer 104, it is supposed that the second tantalum oxide layer 105 does not exist, or it is very thin even if it exists. From these results, it is considered that the second tantalum oxide layer 105 is necessary for enabling resistance variation to occur without the forming process.

In this way, the reversible resistance variations can be confirmed in Examples 2 and 3 in which the second tantalum oxide layer 105 exists. Hereinafter, the results of more specific examination of the resistance variable layers 106 in these Examples will be described.

[Analysis of Resistance Variable Layer]

In order to analyze the structure of the resistance variable layer 106 in this embodiment, samples were prepared by depositing tantalum oxides under the same conditions as those for Examples 1 to 3 on single crystal silicon substrates provided thereon with 200 nm oxide layers, and subjecting the tantalum oxides to irradiation treatment of oxygen plasma. These samples are expressed as A, B, and C, respectively. Table 2 shows the oxygen plasma exposure times and the analysis results (described later) of the respective samples. Pt corresponding to the second electrode layer 107 is not deposited on Samples A to C, and therefore, the resistance variable layers are exposed in Samples A to C.

TABLE 2

| Oxygen plasma exposure time (min) | | | Sample A 0 | Sample B 0.5 | Sample C 1 |
|---|---|---|---|---|---|
| X-ray reflectivity measurement result | TaOx layer | Film thickness(nm) | 29.0 | 28.6 | 28.7 |
| | | δ | 29.4 × 10$^{-6}$ | 29.3 × 10$^{-6}$ | 29.2 × 10$^{-6}$ |
| | | x | 1.41 | 1.43 | 1.43 |
| | TaOy layer | Film thickness(nm) | 1.0 | 1.1 | 1.2 |
| | | δ | 23.1 × 10$^{-6}$ | 22.3 × 10$^{-6}$ | 24.9 × 10$^{-6}$ |
| | | x | 2.34 | 2.45 | 2.07 |

Figure 6:
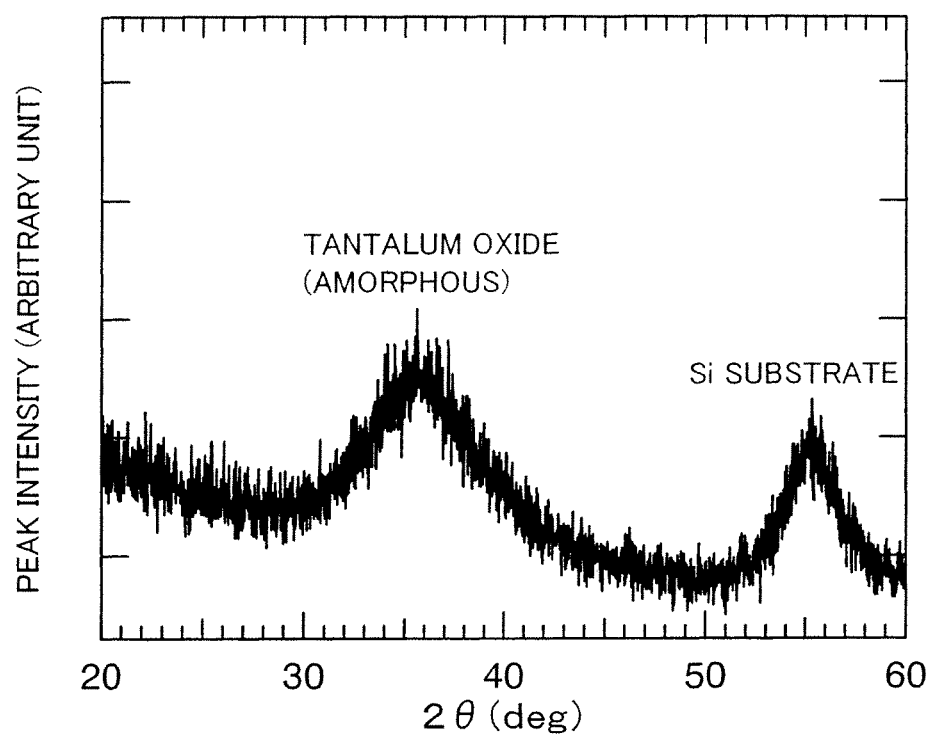
FIG. 6 is a view showing an XRD (X-ray diffraction) spectrum of a resistance variable layer comprising a tantalum oxide according to Embodiment 1 of the present invention.

FIG. 6 is a graph showing an X-ray diffraction spectrum of Sample B. With reference to FIG. 6, it can be seen that a tantalum oxide is formed in Sample B because a peak is observed in a range where 2 θ is about 36 deg. Further, since this peak is a broad peak ranging from 30 to 40 deg., the crystalline state is assumed to be amorphous. A peak generated when 2 θ is 56 deg. is attributed to the silicon substrate. Since similar spectra to that of Sample B were obtained for Samples A and C, it is found that resistance variable layers each comprising an amorphous tantalum oxide as a major component are formed in both samples. However, in the X-ray diffraction measurement, very similar spectra were obtained in Samples, and oxygen plasma exposure time dependency was not observed.

As described above, the X-ray diffraction measurement sensitivity to the samples of this embodiment is not very high. That is, since the resistance variable layers in Samples A to C are very thin (film thickness: 30 nm) and have the amorphous structure as described above, it is difficult to precisely analyze the tantalum oxides from usual X-ray diffraction spectra. Accordingly, more precise analysis was performed using a method called an X-ray reflectivity technique (maker name: Rigaku, software name: X-ray reflectivity data processing software). This is a method of causing an X ray to enter the surface of a sample at a shallow angle, and measuring the intensity of the reflected X ray. Then, an appropriate structural model for the spectrum is assumed to perform fitting, and the film thicknesses and refractive indices of the resistance variable layers in Samples A to C are evaluated. In this case, the parameters of fitting are the layered structure of the resistance variable layer, the film thicknesses and δ (=1−refractive index) of the respective layers.

Figure 7:
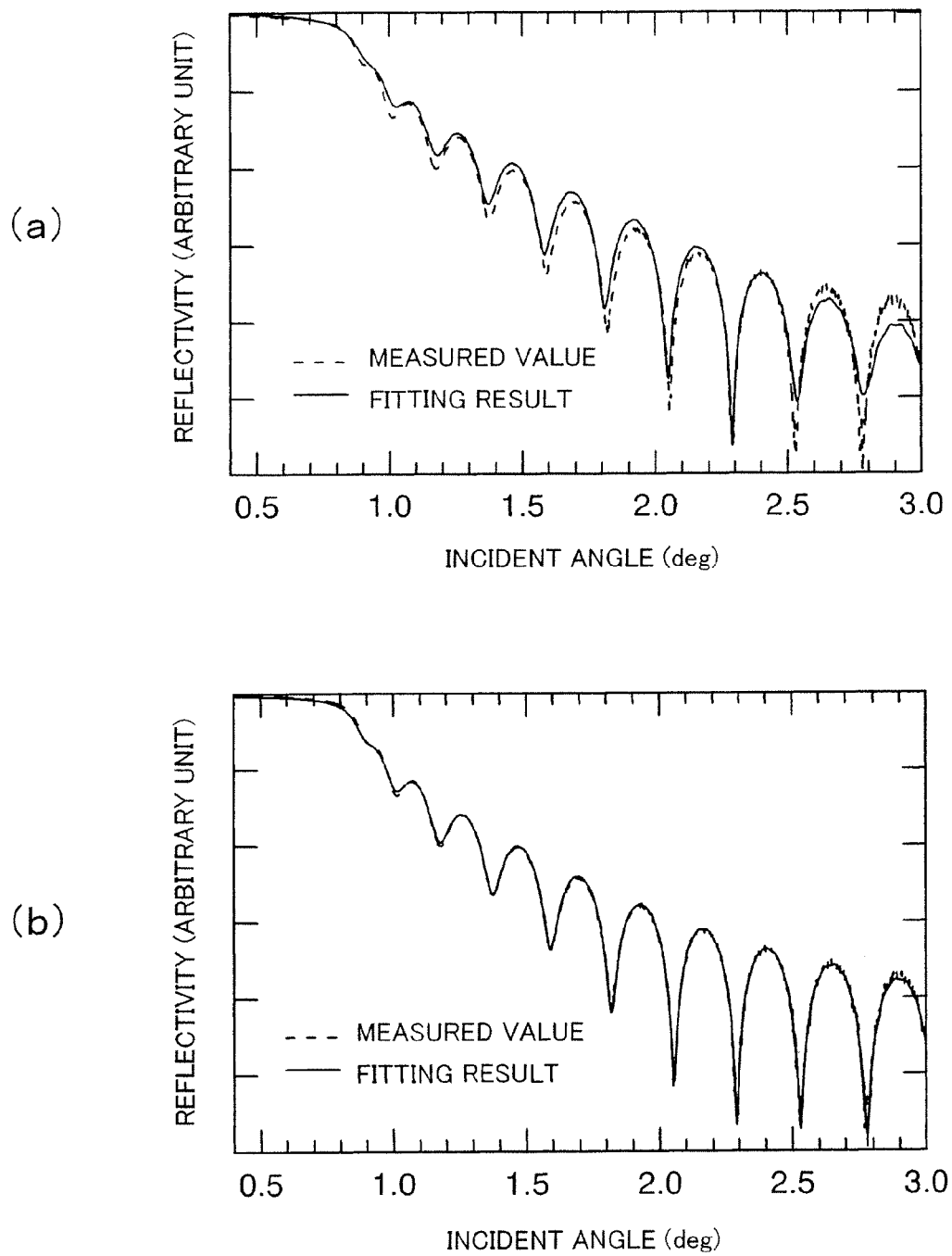
FIGS. 7(a) and 7(b) are views showing X-ray reflectivity spectra of the resistance variable layer comprising the tantalum oxide according to Embodiment 1 of the present invention.

FIG. 7 shows, for example, an X-ray reflectivity measurement pattern for Sample B. In FIG. 7, the horizontal axis shows the X-ray incident angle, and the vertical axis shows the X-ray reflectivity. FIG. 7(a) shows a pattern (broken line) obtained when the X-ray reflectivity of Sample B is actually measured, and a result of fitting (solid line) performed on assumption that a single-layer tantalum oxide layer exists on the substrate. FIG. 7(b) shows a reflectivity pattern (broken line) obtained when Sample B is measured in the same manner, and a result of fitting (solid line) performed on assumption that two tantalum oxide layers exist on the substrate.

Referring to FIG. 7(a), although the measured value roughly coincides with the fitting result, there are minute differences observed. On the other hand, with reference to FIG. 7(b), the reflectivity pattern actually measured coincides with the reflectivity pattern obtained by fitting so perfectly that they cannot be discriminated from each other. From this result, it is thought that Sample B comprises two different tantalum oxide layers, i.e., the first and second tantalum oxide layers.

In the analysis result of Sample B obtained in the fitting performed assuming the two-layer layered structure, as shown in Table 2, the film thickness of the first tantalum oxide layer is 28.6 nm and δ thereof is $29.3 \times 10^{-6}$, while the film thickness of the second tantalum oxide layer is about 1.43 nm and δ thereof is $22.3 \times 10^{-6}$. Generally, δ of metal tantalum is $39 \times 10^{-6}$, and δ of $Ta_2O_5$ is $22 \times 10^{-6}$. Comparing these values with the values obtained in the present case, it can be considered that the first tantalum oxide layer is an oxygen-deficient oxide which apparently deviates from the stoichiometric composition of Ta, such as $TaO_{1.43}$ (x=1.43). Further, the composition ratio of the second tantalum oxide layer obtained from the value of δ is $TaO_{2.45}$ (y=2.45), which is an oxide close to $Ta_2O_5$ ($TaO_{2.5}$). However, it can be considered that the second tantalum oxide layer is an oxygen-deficient oxide which slightly deviates from the stoichiometric composition.

With reference to Table 2, substantially the same results are obtained for Sample C. That is, when the first tantalum oxide layer is represented by $TaO_x$, its film thickness is about 29 nm and x is about 1.4. When the second tantalum oxide layer is represented by $TaO_y$, its film thickness is about 1.2 nm and y is about 2.1. Further, it can be seen from Table 2 that a second tantalum oxide layer of about 1 nm is formed even in Sample A whose oxygen plasma exposure time is 0 min. For this reason, it is unlikely that this oxide layer was formed inside the sputtering apparatus because the interior of the sputtering apparatus where the tantalum oxide was deposited is kept in a high vacuum state having a back pressure of $7 \times 10^{-4}$ Pa. Accordingly, it is considered that a large part of this layer might have been formed in a period from when the sample was taken out of the sputtering apparatus after completion of sputtering until the X-ray reflectivity measurement was conducted (actually, the measurement was conducted a few days after the sample was taken out of the sputtering apparatus). That is, if the second electrode is formed without taking the sample out of the sputtering apparatus, the second tantalum oxide layer will not exist, or it will be less than 1 nm even if it exists.

From similar presumption, it is likely that the film thickness of the second tantalum oxide layer was slightly increased also in Sample B and C because they were exposed to outside air after taken out of the sputtering apparatus where the tantalum oxide was deposited (before the X-ray reflectivity measurement was conducted). However, it is generally known that oxidation tends to progress quickly in an initial stage but thereafter gradually become slow. Accordingly, it is presumed that, if the second tantalum oxide having a high oxygen content rate is formed by exposing it to oxygen plasma inside the sputtering apparatus, the ratio of the second tantalum oxide layer increased outside the sputtering apparatus is small.

The fact that the second tantalum oxide layer exists is consistent with the fact that the initial resistances of the resistance variable layers 106 in Examples 2 and 3 are very high as compared to that obtained when the first tantalum oxide layer is provided as a single layer, as described with reference to Table 1. That is, the resistance values of Examples 2 and 3 are 2 or 3 digits higher than the resistance value of Example 1 in which the second tantalum oxide layer is supposed not to exist. This may be due to the fact that, in Examples 2 and 3, the second tantalum oxide layer 105 having a high oxygen content rate and a very high resistance exists between the first tantalum oxide layer 104 and the second electrode layer 107.

While it is generally thought that $Ta_2O_5$ having a stoichiometric composition is an insulator, the second tantalum oxide layer is not an insulator because oxygen is deficient as compared to $Ta_2O_5$. The definition of insulator in the present invention follows the general definition. To be specific, a material having a resistivity equal to or higher than $10^8$ Ωcm is defined as an insulator (adapted from "Semiconductor Engineering for Integrated Circuits", Engineering Investigation Committee (1992), Akira Usami, Shinnji Kanefusa, Takao Maekawa, Hajime Tomokage, Morio Inoue), and a material having a resistance value less than $10^8$ Ωcm is defined as an electric conductor. In a case where the second tantalum oxide layer of this embodiment is an insulator having a resistivity of $10^8$ Ωcm, its resistance value should be about $1.4 \times 10^8$ Ω (calculated by "resistance value=resistivity× film thickness/area"), if the second tantalum oxide layer is circular in shape having a diameter of 3 μm (the diameter of the element region 109 in this embodiment) and has a film thickness of 1 nm (the rough film thickness of the second tantalum oxide layer). Further, even when the film thickness of the second tantalum oxide layer is 0.1 nm, the resistance value should be $1.4 \times 10^7$ Ω. On the other hand, the resistance values in Examples 2 and 3 are at most $10^3$ to $10^4$ Ω with reference to Table 1, which are at least 3 to 4 digits lower than those in the case where an insulator is assumed. From this calculation result, it is also found that the second tantalum oxide layer formed in this embodiment is not an insulator but an electrically conductive oxide layer.

While in this embodiment the X-ray reflectivity measurement method is used for the analysis of the second tantalum oxide layer, it is also possible to utilize instrumental analytical methods such as Auger electron spectroscopy analysis (AES), fluorescent X-ray analysis (XPS), and electron probe micro analysis (EPMA, it may be called WDS, EDS, or EDX depending on the detection scheme).

[Correlations Between Resistance Varying Characteristics and Film Thickness of Second Tantalum Oxide Layer in Examples 1 to 3]

Since Examples 2 and 3 and Samples B and C were subjected to sputtering and oxygen plasma irradiation treatment under the same conditions, it is supposed that the second tantalum oxide layer 105 exists between the first tantalum oxide layer 104 and the second electrode 107 in Examples 2 and 3 as in Samples B and C. Accordingly, it can be said that the second tantalum oxide layer 105 having a film thickness of 1.1 nm is formed in Example 2 as in Sample B, and the second tantalum oxide layer 105 having a film thickness of 1.2 nm is formed in Example 3 as in Sample C.

As described above, a stable resistance varying phenomenon is recognized without the forming process in Examples 2 and 3. However, in Example 1 where the second tantalum oxide layer having a high oxygen content rate does not exist, such resistance varying phenomenon is not observed without at least the forming process. That is, it is considered that the second tantalum oxide is indispensable to develop resistance variation without the forming process. When this second tantalum oxide is represented by $TaO_y$, it suffices that y is about 2.1 and the film thickness thereof is about 1 nm within the scope of this embodiment.

[Mechanism of Resistance Variation and Role of Second Tantalum Oxide Layer]

Regarding the role of the second tantalum oxide layer, it is not clear under the existing circumstances where the mechanism of the resistance varying phenomenon itself is not clarified. However, since the presence of the second tantalum oxide layer is confirmed, the following presumption may be made. Assuming that the resistance variation in the resistance variable nonvolatile element of this embodiment is caused by migration of oxygen atoms at an interface between the electrode and the tantalum oxide layer, it can be considered that the second tantalum oxide layer serves to effectively apply a voltage to a region in the vicinity of the interface. That is, it is considered that the resistance varying phenomenon is developed by the event that the oxygen atoms are gathered and diffused due to an electric field in the vicinity of the interface between the second electrode layer 107 and the tantalum oxide layer 106. To be specific, when a positive voltage is applied to the second electrode layer 107, negatively charged oxygen atoms are gathered toward the second electrode layer 107 and form a high-resistance layer, thereby attaining a high-resistance state. Conversely, when a negative voltage is applied, the oxygen atoms are diffused inside the tantalum oxide layer and thereby the resistance is reduced. If the second tantalum oxide layer 105 as a high-resistance layer exists at the interface (to be precise, the interface at the tantalum oxide layer 106 side), a large voltage is applied to this portion, and oxygen is injected into the high-resistance layer 105, thereby further increasing the oxygen content rate thereof. Thus, the high-resistance layer 105 becomes closer to $Ta_2O_5$ having the stoichiometric composition known as an insulator. As the result, the resistance of the element itself is increased, and the element turns to the high-resistance state. However, if the second tantalum oxide layer 105 as a high-resistance layer does not exist at the interface, the voltage is applied evenly to the tantalum oxide layer 106, making it difficult to form a high-resistance layer which is close to an insulator in the vicinity of the interface. As the result, the resistance varying phenomenon is less likely to occur. However, if a layer similar to the second tantalum oxide layer 105 is once formed by applying a voltage higher than the voltage to operate the element steadily (in this embodiment, a voltage higher than −2V or 3V) or by applying a number of electric pulses, i.e., by performing the forming process even in the case where the second tantalum oxide layer 105 does not exist, stable resistance variation can be expected thereafter.

Further, according to the above described mechanism, it can be said that the high-resistance state is likely to be formed when an electric pulse having a positive voltage is applied to the electrode in contact with the second tantalum oxide layer 105 (for example, in the configuration as shown in FIG. 1, an electric pulse having a voltage higher than that applied to the first electrode layer 103 is applied to the second electrode layer 107), whereas the low-resistance state is likely to be formed when a negative voltage is applied. It should be noted that, if a layer having a high oxygen content rate, which is similar to the second tantalum oxide layer, is formed by the forming process on the electrode side which is not in contact with the second tantalum oxide layer 105, it is possible to attain an operation which shows resistance variations reverse to those described above. Therefore, the above described relation between the polarity of the applied voltage and the resistance value is not necessarily satisfied. Further, the resistance variable layer 106 is not necessarily formed by the layer 104 of a low oxygen content and the layer 105 of a high oxygen content so long as at least the portion positioned between the both electrodes 103 and 107 includes a low oxygen content region and a high oxygen content region which are arranged in its thickness direction. Accordingly, the resistance variable layer 106 may be formed such that the oxygen content of the oxygen-deficient tantalum oxide has a profile (distribution) in its thickness direction. Further, according to the above described mechanism, it is considered that the resistance varying phenomenon occurs over the entire range of the oxygen content (z) in the oxygen-deficient tantalum oxide ($TaO_z$ (0<z<2.5)). Note that the extent of the resistance variation may differ depending on the oxygen content as described later.

Moreover, according to the above described mechanism, the second tantalum oxide layer is not necessarily provided between the first tantalum oxide layer and the second electrode, but may be provided as shown in the following modifications.

Figure 8:
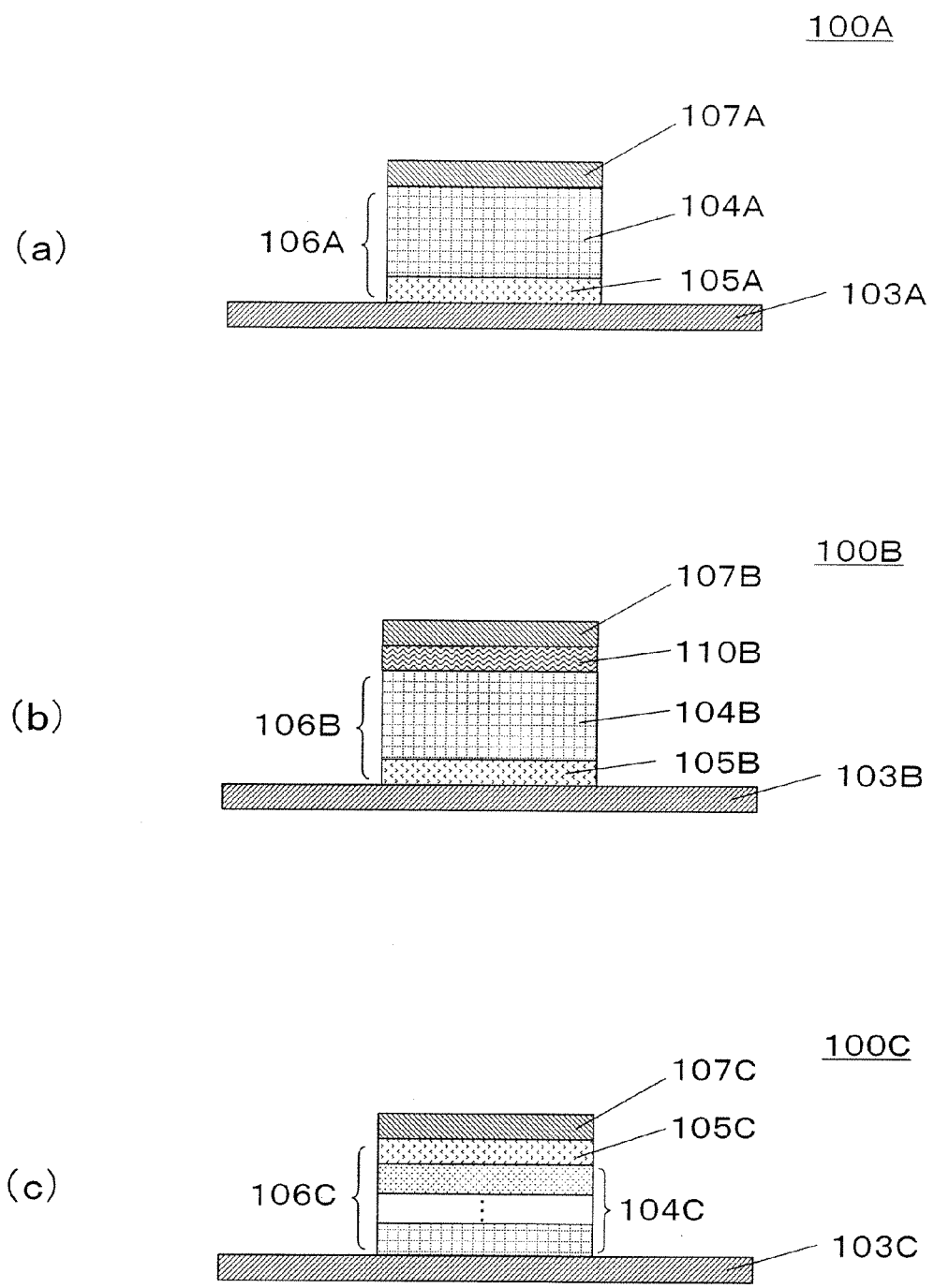
FIGS. 8(a) to 8(c) are cross-sectional views showing configurations of modifications of the nonvolatile memory element according to Embodiment 1 of the present invention.

FIG. 8 is a cross-sectional view showing a configuration of a modification of the nonvolatile memory element according to Embodiment 1 of the present invention. In FIG. 8, the substrate and the oxide layer are omitted for the sake of convenience.

As shown in FIG. 8(a), a second tantalum oxide layer 105A may be deposited on a first electrode layer 103A. In this case, a resistance variable layer 106A comprises the second tantalum oxide layer 105A and the first tantalum oxide layer 104A which are stacked in this order.

Further, as shown in FIG. 8(b), a first electrode layer 103B, a second tantalum oxide layer 105B, and a first tantalum oxide layer 104B may be stacked in this order, a third tantalum oxide layer 110B of a similar composition to the second tantalum oxide layer 105B may be deposited thereon, and further, a second electrode layer 107B may be deposited thereon. In this case, a resistance variable layer 106B comprises the second tantalum oxide layer 105B, the first tantalum oxide layer 104B, and the third tantalum oxide layer 110B which are stacked in this order.

In the structures of FIG. 8(a) and FIG. 8(b), it is difficult to form the second tantalum oxide layer 105 by oxidation, and therefore, the second tantalum oxide layer 105 must be formed by deposition using sputtering or chemical vapor deposition. For example, when the sputtering process is used, initially, the second tantalum oxide layer 105 of a high oxygen content and a high resistance is formed by performing sputtering under the condition where the oxygen gas flow rate ratio during deposition is high (when the sputtering condition described in [Method of Manufacturing Nonvolatile Memory Element] is used, the second tantalum oxide layer 105 can be formed by setting the oxygen gas flow rate ratio to about 7 to 8%). Thereafter, the first tantalum oxide layer 104 is deposited with the oxygen gas flow rate ratio set lower, thereby completing the structures shown in FIG. 8(a) and FIG. 8(b).

Further, as shown in FIG. 8(c), a first tantalum oxide layer 104C may be formed of, not a single layer, but two or more tantalum oxide layers of different compositions. Alternatively, the first tantalum oxide layer 104C may be formed of a tantalum oxide layer whose composition continuously changes. In this case, it is required that the oxygen content rate of the second tantalum oxide layer 105C be higher than the oxygen content rates of the respective layers forming the first tantalum oxide layer 104C. Although the second tantalum oxide layer 105C is shown as contacting the second electrode in FIG. 8(c), the second tantalum oxide layer may be provided at first electrode side as shown in FIG. 8(a), or the two second tantalum oxide layers may be provided at both of the first and second electrodes as shown in FIG. 8(b).

[Film Thickness of First Tantalum Oxide Layer]

Next, in order to examine the effect of the film thickness of the first tantalum oxide layer 104 on the resistance varying phenomenon, a nonvolatile memory element (Example 4) having a first tantalum oxide layer of a film thickness different from those of Examples 1 and 2 was manufactured, and the resistance varying characteristic thereof was examined. Example 4 is different from Example 2 only in the film thickness of the first tantalum oxide layer 104. The film thickness of the first tantalum oxide layer 104 was 90 nm in Example 4 while it was 30 nm in Example 2. The oxygen plasma exposure time used when manufacturing Example 4 was 0.5 min as in Example 2. Therefore, it is supposed that, also in Example 4, the film thickness of the second tantalum oxide layer 105 is about 1 to 2 nm.

Figure 9:
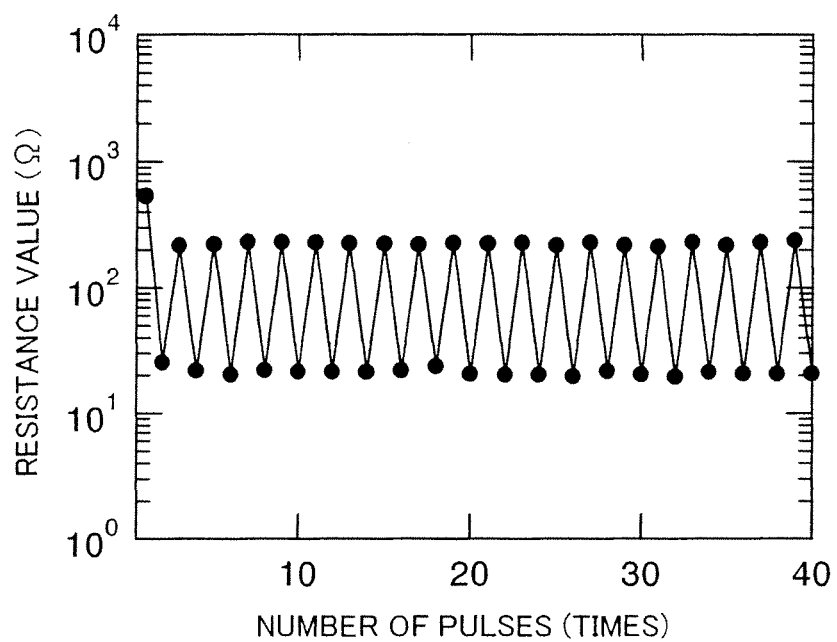
FIG. 9 is a view showing the relation between the resistance value of the resistance variable layer included in the nonvolatile memory element according to Embodiment 1 of the present invention, and the number of times of pulse applications.

FIG. 9 shows the resistance varying characteristics obtained when an electric pulse of a negative voltage (−2.0V) and an electric pulse of a positive voltage (3.0V) each having a pulse width of 100 nsec are alternately and repeatedly applied between the second electrode layer 107 and the first electrode layer 103 in Example 4. As shown in FIG. 9, also in Example 4, the resistance value varies from about 500Ω to 20Ω by applying −2.0V without a need for the forming process, and thereafter, resistance variation occurs reversibly between about 20Ω and about 200 Ω.

From the above described result, it can be said that the film thickness of the first tantalum oxide layer does not significantly affect the resistance varying phenomenon in the nonvolatile memory element according to this embodiment.

[Relation Between Width of Applied Electric Pulse and Resistance Value]

Next, a description will be made of the relation between the width of the electric pulse applied between the electrodes and the resistance varying characteristics of the resistance variable layer 106 in the nonvolatile memory element 100 of this embodiment.

Figure 10:
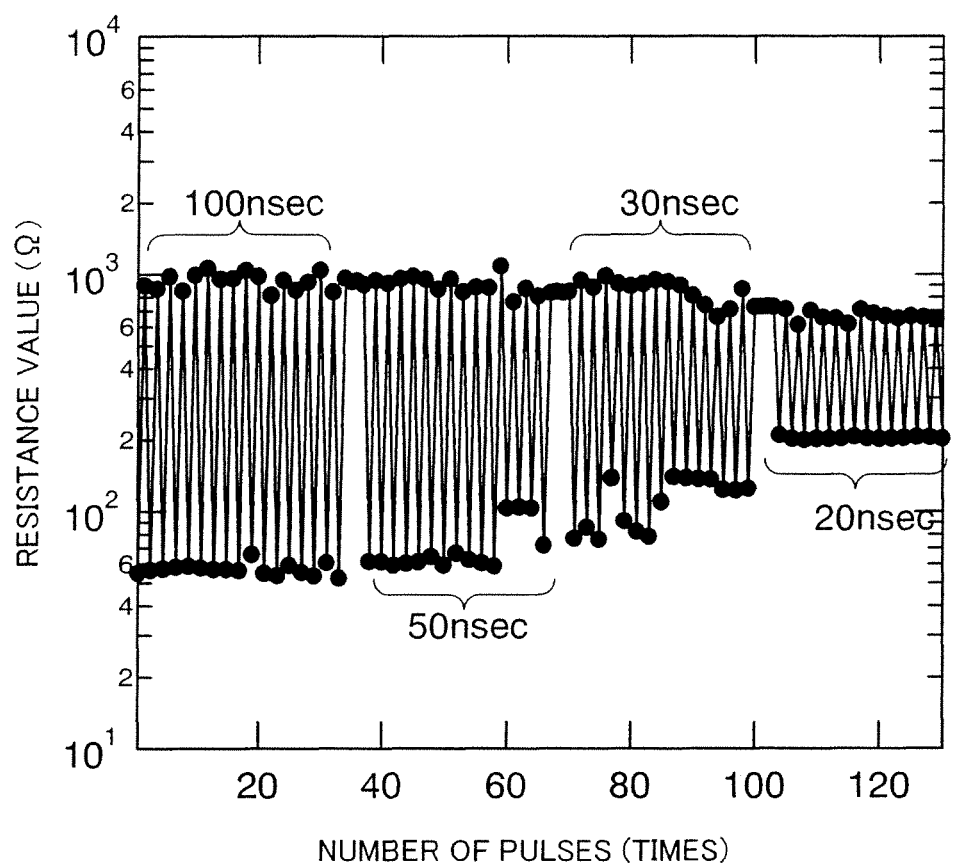
FIG. 10 is a view showing the relation between the width of an electric pulse applied between electrodes and the resistance value of the resistance variable layer, in a case where the nonvolatile memory element according to Embodiment 1 of the present invention operates.

FIG. 10 shows the resistance varying characteristic of the resistance variable layer 106 obtained when the width of the electric pulse applied between the electrodes is changed in Example 2. The changes of the widths of the electric pulse are such that 100 nsec, 50 nsec, 30 nsec, and 20 nsec, and the resistance is changed about 30 times for each pulse width. As can be seen from FIG. 10, as the width of the applied electric pulse decreases, the width of the resistance variation (a difference between the resistance value of the high-resistance state and the resistance value of the low-resistance state) gradually decreases. Nonetheless, the resistance varying phenomenon can be observed even when the applied pulse is a ultrafast pulse of 20 nsec.

From the above, it can be said that the nonvolatile memory element of this embodiment operates relatively stably even when a ultrafast pulse is used.

[Imprinting Characteristics of Nonvolatile Memory Element]

Next, a description will be made of the imprinting characteristics of the resistance value of the nonvolatile memory element 100 according to this embodiment in the case where electric pulses having the same polarity are continuously applied between the electrodes.

Figure 11:
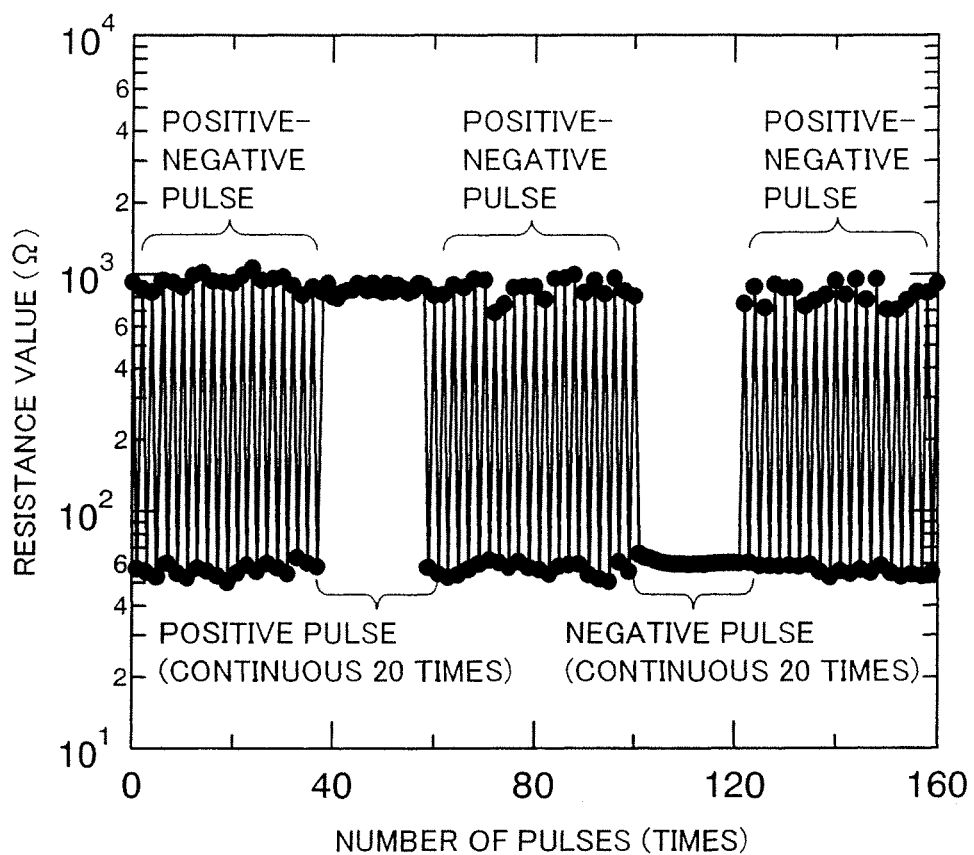
FIG. 11 is a view showing a resistance varying characteristics of the resistance variable layer in a case where electric pulses having the same polarity are continuously applied between the electrodes in the nonvolatile memory element according to Embodiment 1 of the present invention.

FIG. 11 is a view showing the resistance varying characteristic of the resistance variable layer 106 in the case where a positive or a negative electric pulse is continuously applied between the electrodes in Example 2. In this case, a unipolar positive or negative electric pulse is applied continuously twenty times between the electrodes of Example 2 to continuously form a high-resistance state or a low-resistance state, and before and after forming the high-resistance state or the low-resistance state, positive and negative electric pulses are repeatedly applied to vary the resistance state.

First, it is confirmed that, when positive and negative electric pulses are applied about forty times between the electrodes of the nonvolatile memory element 100, the high-resistance state and the low-resistance state reversibly vary as shown in FIG. 11. Next, the positive electric pulse is continuously applied twenty times to continuously form the high-resistance state, and thereafter, the positive and negative electric pulses are again applied alternately and continuously about forty times. Also, in this case, the high-resistance state or the low-resistance state is stably repeated as shown in FIG. 11. It is confirmed from this result that the resistance variation can occur with stability even when the positive electric pulses are continuously applied.

Furthermore, after the negative electric pulse is continuously applied twenty times to continuously form the low-resistance state, the positive and negative electric pulses are again applied alternately and continuously about forty times. Also, in this case, the high-resistance state or the low-resistance state is stably repeated as shown in FIG. 11. It is confirmed from this result that the resistance variation can occur stably even when the negative electric pulses are continuously applied.

From the above, it is found that the nonvolatile memory element 100 of this embodiment has high imprinting resistance. Accordingly, the nonvolatile memory element 100 of this embodiment can be expected to operate stably.

[Endurance Characteristics of Nonvolatile Memory Element]

Figure 12:
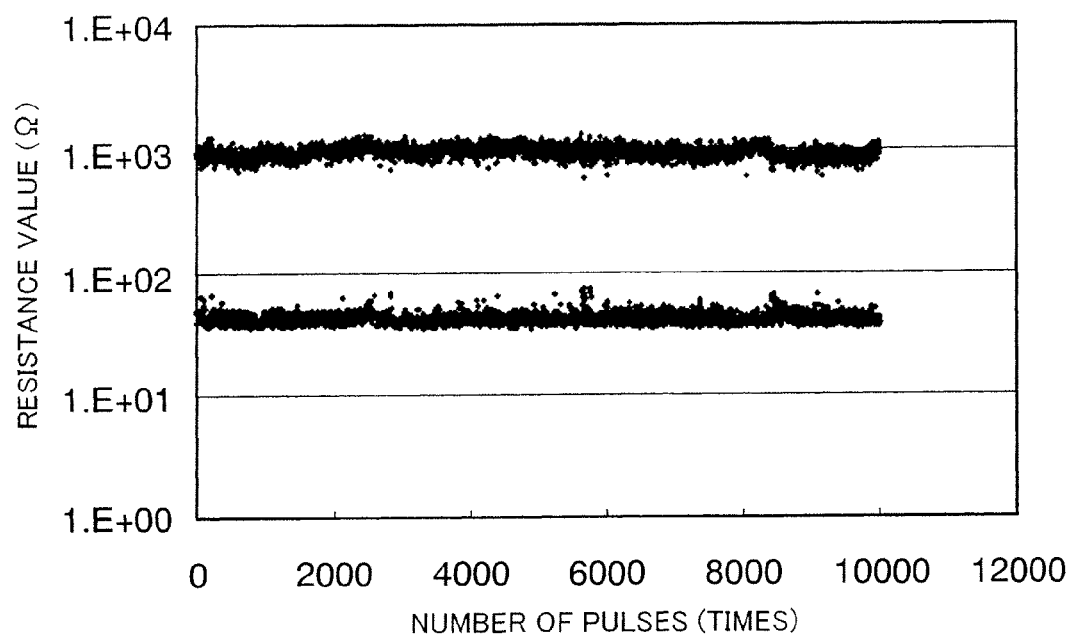
FIG. 12 is a view showing a resistance varying characteristic of the resistance variable layer in a case where positive and negative electric pulses are applied between the electrodes alternately and continuously 10000 times in the nonvolatile memory element according to Embodiment 1 of the present invention.

FIG. 12 shows the result of examination on the endurance of the resistance varying phenomenon occurring under the condition in which the positive and negative pulses are alternately and continuously applied to Example 2. FIG. 12 shows the measurement result obtained for up to 10000 times of pulse application. As can be seen from FIG. 12, even when the pulses are applied 10000 times, the resistance value of the high-resistance state does not vary and the resistance value of the low-resistance state does not very, and the resistance values are approximately constant at 1000Ω and 60Ω, respectively. FIG. 12 does not imply that the resistance varying phenomenon disappeared after the 10000 times of pulse application. The element exhibited the stable resistance variation even after the 10000 times of pulse application.

From the above, it can be concluded that the nonvolatile memory element 100 of this embodiment is excellent in endurance.

[Retention Characteristics of Nonvolatile Memory Element]

Next, the retention characteristics of the nonvolatile memory element 100 according to this embodiment will be described.

In Example 2, variations in the resistance value of the resistance variable layer 106 were measured under the environments of 210° C., 180° C., and 125° C. Although the resistance value did not significantly vary from its initial resistance value when the element was placed in the low-resistance state, the resistance value varied from its initial resistance value when the element was placed in the high-resistance state. From this, it is considered that the retention characteristic of the nonvolatile memory element 100 of Embodiment 1 is determined by how the resistance value of the high-resistance state varies. The resistance values which are the middle of the high-resistance value and the low-resistance value in the initial state were used as references, and time taken to reach these references was measured. The time was about 0.15 hour at 210° C., 7 hours at 180° C., and 700 hours at 125° C.

Figure 13:
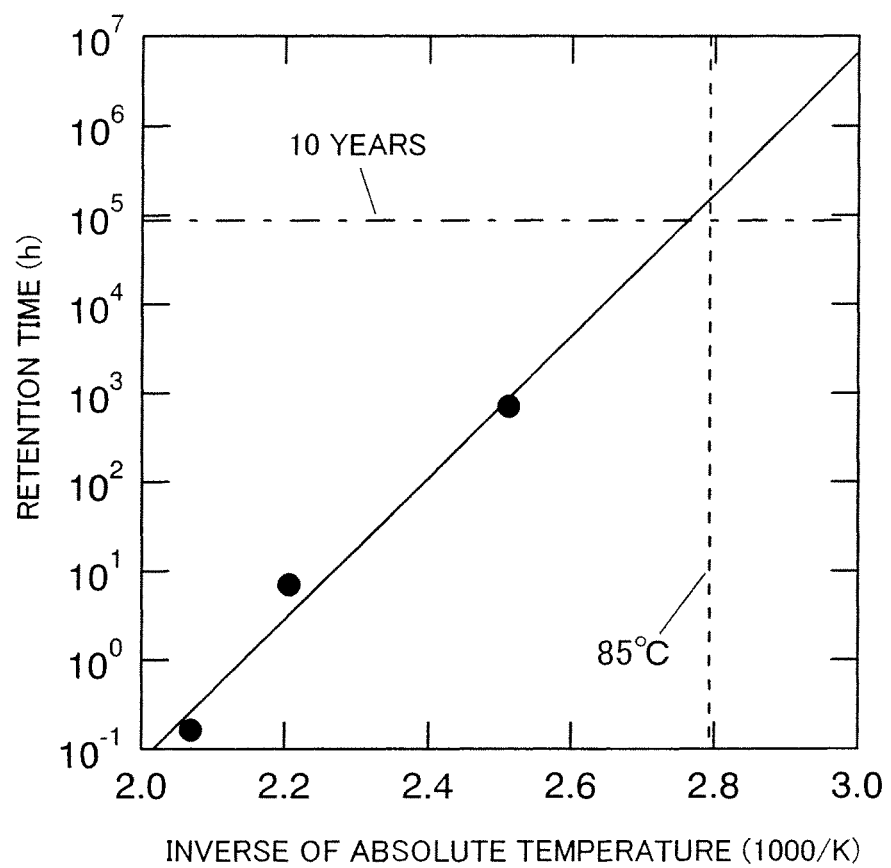
FIG. 13 is a view showing Arrhenius plots with respect to the nonvolatile memory element according to Embodiment 1 of the present invention.

FIG. 13 shows Arrhenius plots of temperature and retention time. It is presumed from FIG. 13 that the retention period will exceed 10 years under the environment of 85° C. or below. This shows that the nonvolatile memory element of this embodiment has very high retention characteristic.

(Embodiment 2)

In Embodiment 1, after the first tantalum oxide layer was deposited inside the sputtering apparatus, oxidation treatment using oxygen plasma was subsequently performed to form the second tantalum oxide layer. In this method, however, a thick second tantalum oxide layer was not be able to be formed because of the used apparatus. Therefore, in Embodiment 2, the operation of a nonvolatile memory element having a thick second tantalum oxide layer will be described.

[Method of Manufacturing Nonvolatile Memory Element]

The method of manufacturing the nonvolatile memory element is fundamentally identical to that of Embodiment 1. However, for the convenience of the oxidation process, the deposition condition of the tantalum oxide and the size of the manufactured nonvolatile memory element are different from those of Embodiment 1. Hereinafter, the process of manufacturing the nonvolatile memory element will be described with reference to FIG. 2.

Initially, as shown in FIG. 2(a), an oxide layer 102 having a 200 nm thickness is formed on a single crystal crystalline silicon substrate 101 by the thermal oxidation process. Then, a Pt thin film having a thickness of 100 nm which is the first electrode layer 103 is formed on the oxide layer 102 by the sputtering process. Thereafter, the first tantalum oxide layer 104 is formed on the first electrode layer 103 by the reactive sputtering process using a Ta target.

The first tantalum oxide layer 104 is deposited under the conditions described below. That is, after the substrate is set in the sputtering apparatus, the interior of the sputtering apparatus is evacuated up to about $8 \times 10^{-6}$ Pa. Then, using tantalum as a target, sputtering is performed for 20 sec at a power of 1.6 kW, while flowing argon gas at 34 sccm and oxygen gas at 21 sccm and keeping the pressure inside the sputtering apparatus at 0.17 Pa. Thereby, a first tantalum oxide layer having a resistivity of 6 mΩcm and an oxygen content rate of about 61 at % ($TaO_{1.6}$) can be deposited to have a thickness of 30 nm.

Next, as shown in FIG. 2(b), the uppermost surface of the first tantalum oxide layer 104 is oxidized to reform the same. Examples 5 to 7 were manufactured in such a way that the oxidation treatment method was changed as shown in Table 3.

TABLE 3

| Oxidation method | Example 5 Oxygen plasma oxidation(250° C.) | Example 6 Lamp anneal oxidation(300° C.) | Example 7 No oxidation |
|---|---|---|---|
| Initial resistance(Ω) | 426 | 610 | 39.3 |

To be specific, regarding Example 5, the substrate was taken out of the sputtering apparatus after sputtering was completed, and introduced into an oxygen plasma generation apparatus, where oxidation treatment was carried out in such a manner that the substrate was increased in temperature up to 250° C. and exposed to oxygen plasma. Regarding Example 6, the substrate was introduced into a lamp anneal apparatus, where oxidation treatment was carried out in such a manner that the substrate was increased in temperature up to 300° C. and oxygen gas was flowed. Through these oxidation treatment, second tantalum oxide layers 105 having an oxygen content rate higher than that of the first tantalum oxide layers 104 were formed (the analysis result for the film thickness and composition of the second tantalum oxide layer will be described later). In contrast, Example 7 is a comparative example which was not subjected to oxidation treatment.

Thereafter, a Pt thin film having a thickness of 150 nm which is a second electrode layer 107 was formed on the second tantalum oxide layer 105 by the sputtering process. In order to prevent the second tantalum oxide layer 105 from being oxidized in the atmosphere, the second electrode layer 107 was formed immediately after the deposition of the second tantalum oxide layer 105. Finally, a photoresist pattern 108 was formed in a photoresist process, and an element region 109 was formed by dry etching. The element region 109 was shaped in a square having each side of 0.5 μm.

[Resistance Varying Characteristics of Examples 5 and 7]

Next, a description will be made of the characteristics obtained when resistance variations were caused by applying electric pulses to Examples 5 and 7 which were actually manufactured in this embodiment.

Figure 14:
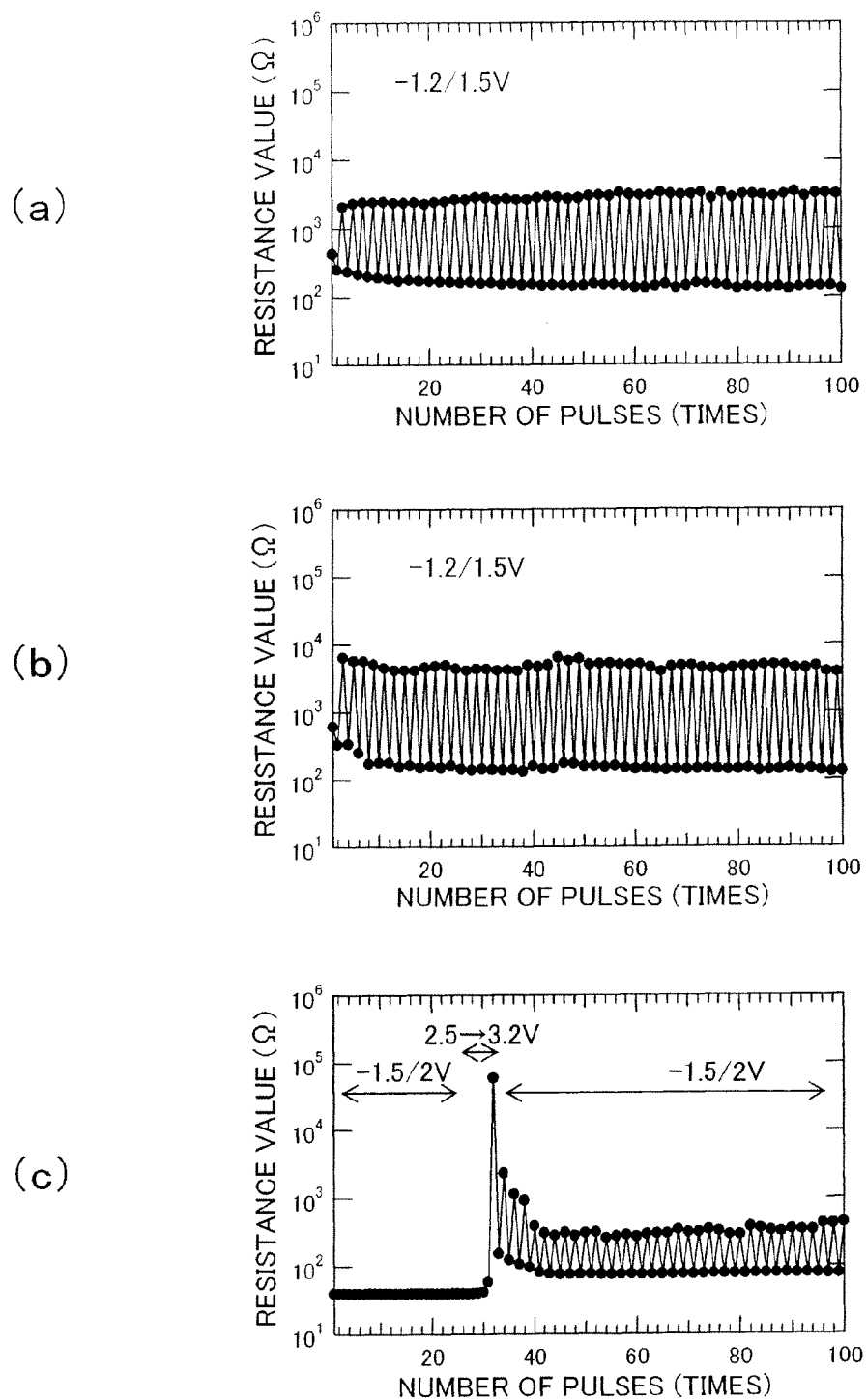
FIGS. 14(a) to 14(c) are views showing the relation between the resistance value of a resistance variable layer included in a nonvolatile memory element according to Embodiment 2 of the present invention, and the number of times of pulse applications.

FIG. 14 is a view showing the relation between the resistance value of the resistance variable layer included in the nonvolatile memory element according to Embodiment 2 and the applied electric pulses, wherein 14(a) to 14(c) show the measurement results for Examples 5 to 7, respectively.

First, a description will be made of the result for Example 5 in which the second tantalum oxide layer was formed by performing oxidation treatment using oxygen plasma. As can be seen from the result of FIG. 14(a), when a negative voltage of −1.2V is applied to the nonvolatile memory element immediately after being manufactured, the resistance value which was initially about 400Ω decreases to about 200Ω. When a positive voltage of 1.5V is applied, the resistance value increases to about 2000Ω. That is, resistance variation occurs without the forming process. Thereafter, the resistance value is varied between about 200Ω and about 3000Ω by alternately applying the electric pulses of the negative voltage −1.2V and the positive voltage 1.5V, and thus desirable resistance variation is attained.

As can be seen from the result of FIG. 14(a), it is found that stable resistance variation occurs without the forming process. That is, the resistance which was initially about 600Ω decreases to about 300Ω by applying the negative voltage of −1.2V, and increases to about 5000Ω by applying the positive voltage of 1.5V. Thereafter, the resistance value is varied between about 200Ω and about 5000Ω by alternately applying the electric pulses of the negative voltage of −1.2V and the positive voltage of 1.5V, and thus desirable resistance variation is attained.

However, the result obtained for Example 7 in which the first tantalum oxide layer is not oxidized, which is shown in FIG. 14(c), is significantly different from the above result. That is, Example 7 immediately after manufactured did not show the resistance variation even through a negative voltage of −1.5V and a positive voltage of 2.5V which are higher than those applied to Examples 5 and 6 were applied. It can be seen that voltage is increased 0.1V by 0.1V from the positive voltage of 2.5V (the range from the 26th pulse to the 32nd pulse on the horizontal axis in FIG. 14(c)), the resistance value dramatically increases from about 40Ω to about 60000Ω at 3.2V. Thereafter, resistance variation is caused by applying the electric pulses of the negative voltage −1.5V and the positive voltage 2.0V. It is thought that the process of increasing the applied voltage from 2.5V to 3.2V corresponds to the forming process disclosed in the prior art. That is, it is supposed that a high-resistance layer corresponding to the second tantalum oxide layer 105 might be formed in the vicinity of the surface of the first tantalum oxide layer 104 in this process.

As is evident from the above examples, it is obvious that the nonvolatile memory element does not operate without the forming process unless the second tantalum oxide layer is formed. That is, it is considered that the second tantalum oxide layer is indispensable in order to operate the nonvolatile memory element without the forming process.

[Analysis of Resistance Variable Layer]

In order to analyze the structure of the resistance variable layer 106 of this embodiment, samples were prepared by depositing a tantalum oxide on a single crystal silicon substrate provided thereon with a 200 nm thick oxide layer and then subjecting the substrate to oxidation treatment under the same conditions as those for Examples 5 and 6. These samples are expressed as D and E. The results of X-ray reflectivity measurements for the respective samples are shown in Table 4. In Samples D and E, the second tantalum oxide layer is exposed as in Samples A and C.

TABLE 4

| Oxidation method | | | Sample D Oxygen plasma oxidation (250° C.) | Sample E Lamp anneal oxidation (300° C.) |
|---|---|---|---|---|
| X-ray reflectivity measurement Result | TaOx layer | Film thickness(nm) | 26.6 | 27.9 |
| | | δ | $28.5 \times 10^{-6}$ | $28.2 \times 10^{-6}$ |
| | | x | 1.54 | 1.59 |
| | TaOy layer | Film thickness(nm) | 8.1 | 7.3 |
| | | δ | $22.2 \times 10^{-6}$ | $22.8 \times 10^{-6}$ |
| | | y | 2.47 | 2.38 |

With reference to Table 4, in Sample D which was fowled by oxidation using oxygen plasma, the film thickness of the second tantalum oxide layer $TaO_y$ is, as originally aimed, 8.1 nm which is thicker than those of Samples A to C. Further, y is 2.47, which means that oxygen is deficient as compared to $Ta_2O_5$ having the stoichiometric composition. In Sample E which was formed by oxidation using the lamp anneal apparatus, the film thickness of the second tantalum oxide layer $TaO_y$ is 7.3 nm, and y is 2.38.

It is now found that there is an inconsistency between the result of the X-ray reflectivity measurement and the initial resistance value of the sample formed into the nonvolatile memory element. To be specific, although the result of the X-ray reflectivity measurement shows that the film thickness and the value of y of Sample D for which the oxygen plasma oxidation treatment was performed are larger than those of Sample E for which the lamp anneal oxidation treatment was performed (see Table 4), the initial resistance is smaller in Example 5 for which oxygen plasma oxidation treatment was performed than in Example 6 for which lamp anneal oxidation treatment was performed (Table 3). One of causes for this inconsistency which can be considered at the present stage is the variation in the initial resistance. That is, it is supposed that the initial resistance of Example 5 became somewhat accidentally smaller than the initial resistance of Example 6. Another possible cause is the quality of the second tantalum oxide layer. In this embodiment, although the film thickness and composition of the second tantalum oxide layer are evaluated, evaluation for defects or the like cannot be performed because measurement therefor is very difficult. It is generally considered that more defects might be formed when the oxide film is formed in plasma than when it is formed by an ordinary oxidation process such as lamp anneal. If many defects are formed, electric charges might flow through the defects, which results in the event that the initial resistance of Example 5 becomes lower than that of Example 6.

[Cross-Section Observation for Nonvolatile Memory Element]

Figure 15:
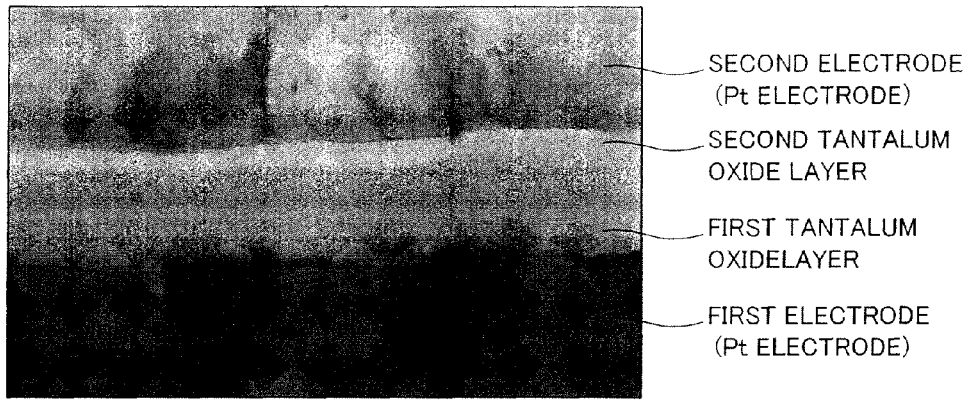
FIGS. 15(a) and 15(b) are a transmission electron microscope photograph and a sketch thereof at a cross section of Example 5 of the nonvolatile memory element according to Embodiment 2 of the present invention, respectively.
Figure 15:
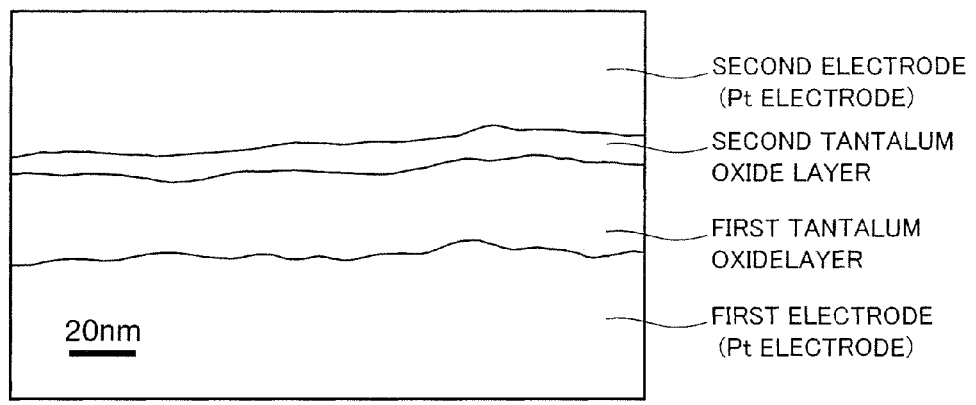

As described above, the film thickness of the second tantalum oxide layer in the nonvolatile memory element manufactured in this embodiment is about 7 to 8 nm. With this film thickness, the second tantalum layer can be easily observed by performing cross-section observation for the nonvolatile memory element using a transmission electron microscope. Accordingly, the cross-section observation for the nonvolatile memory element of Example 5 in which the second tantalum oxide layer was formed by oxygen plasma oxidation was actually carried out. The result is shown in FIG. 15(a). FIG. 15(b) is a sketch of a photograph shown in FIG. 15(a).

As can be clearly seen from these figures, the first electrode made of Pt (first electrode layer), the first tantalum oxide layer, the second tantalum oxide layer, and the second electrode made of Pt (second electrode layer) can be clearly confirmed. It is also found that the film thickness of the first tantalum oxide layer is about 28 nm although there is some variation, and the film thickness of the second tantalum layer is about 8 nm. These values substantially coincide with the results of the X-ray reflectivity measurement for Sample D manufactured under the same oxidation condition (from Table 4, the film thickness of the first tantalum oxide layer is 26.6 nm and the film thickness of the second tantalum oxide layer is 8.1 nm). For the above reasons, it becomes apparent that the second tantalum oxide layer actually exists in the nonvolatile memory element manufactured by the method of this embodiment. Further, it was also an evidence of validity of the analysis result obtained by the X-ray reflectivity measurement. Furthermore, when the data of Samples A to E are taken together, it was verified that the film thickness of the second tantalum oxide layer is desired to be not smaller than 1 nm and not larger than 8 nm substantially (accurately, not smaller than 1.1 nm and not larger than 8.1 nm).

(Embodiment 3)

In the above described nonvolatile memory element 100 according to Embodiment 1, the oxygen content rate of the first tantalum oxide layer 104 was 58 at % ($TaO_{1.4}$). The oxygen content rate of the first tantalum oxide layer 104 in the nonvolatile memory element 100 according to Embodiment 2 was close to that of Embodiment 1, i.e., 61 at % ($TaO_{1.6}$). In contrast, a nonvolatile memory element according to Embodiment 3 includes a first tantalum oxide layer whose oxygen content rate is varied in a little larger range. Since the other constituents of Embodiment 3 are identical to those of Examples 1 and 2, illustration thereof will be omitted. Hereinafter, a description will be made of the manufacturing methods and the resistance varying characteristics of Examples in this embodiment which are manufactured in such a way that the oxygen content rate of the first tantalum oxide layer is changed, with reference to FIG. 1.

[Relation Between Oxygen Flow Rate Ratio During Sputtering and Composition]

Figure 16:
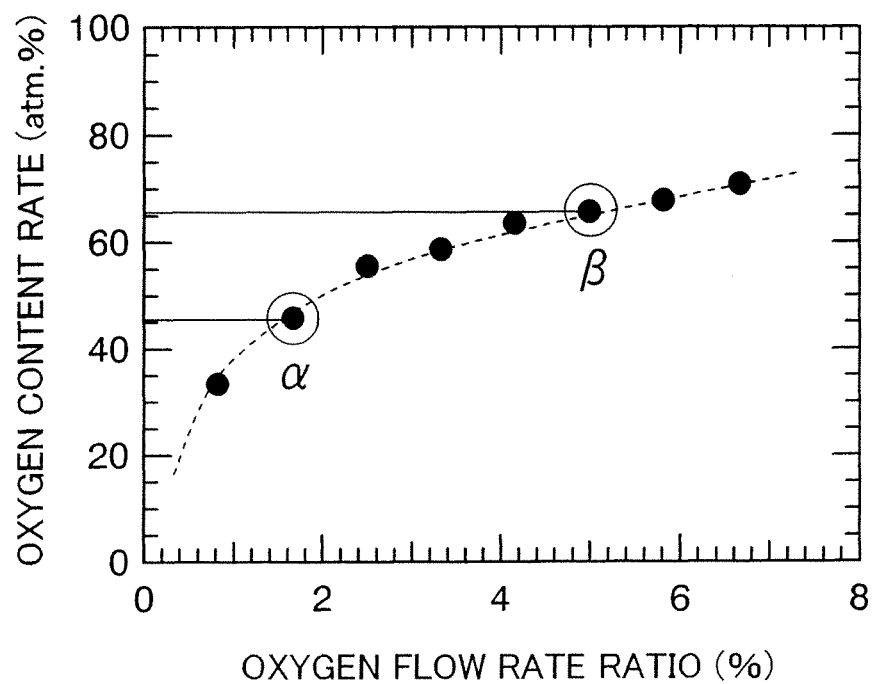
FIG. 16 is a view showing the relation between an oxygen flow rate ratio during sputtering of a resistance variable layer comprising a tantalum oxide layer included in a nonvolatile memory element according to Embodiment 3 of the present invention, and an oxygen content rate in the tantalum oxide layer.

First, the tantalum oxide manufacture conditions and the analysis result of the oxygen content rate in this embodiment will be described. The tantalum oxide is formed by a similar method to that described in Embodiment 1. The oxygen content rate of the tantalum oxide is controlled by controlling the oxygen flow rate ratio during sputtering. The specific processes during sputtering will be described. Initially, the substrate is set inside the sputtering apparatus, and the interior of the sputtering apparatus is evacuated up to about $7 \times 10^{-4}$ Pa. Then, sputtering is performed using tantalum as a target, under the condition in which the power is 250 W, the total gas pressure including argon gas and oxygen gas is 3.3 Pa, and the temperature of the substrate is set at 30° C. The flow rate ratio of oxygen gas is changed from 0.8% to 6.7%. Since it is an aim to examine the composition, a substrate obtained by depositing 200 nm thick $SiO_2$ on Si is used, and the sputtering time is adjusted so that the film thickness of the tantalum oxide layer becomes about 100 nm. Exposure to oxygen plasma as described in Embodiment 1 is not performed. The composition of the tantalum oxide layer thus manufactured is analyzed by Rutherford back scattering (RBS) and Auger electron spectroscopy (AES), and the analysis result is shown in FIG. 16. It can be seen from FIG. 16 that the oxygen content rate in the tantalum oxide layer is changed from about 40 at % ($TaO_{0.66}$) to about 70 at % ($TaO_{2.3}$) when the oxygen partial pressure ratio is changed from 0.8% to 6.7%. That is, it is found that the oxygen content rate in the tantalum oxide layer is controllable based on the oxygen flow rate ratio.

It is supposed that the sample prepared for the composition measurement was oxidized by oxygen in the atmosphere in a period after the deposition on the substrate until the measurement and thereby a high oxygen content layer was formed on the surface. However, since the surface was etched before performing the measurement by RBS and AES, the effect of this high oxygen content layer on the surface on the measurement of the oxygen content rate is negligible.

While in this embodiment Rutherford back scattering (RBS) and Auger electron spectroscopy (AES) are used for the analysis of the tantalum oxide layer, instrumental analysis techniques such as fluorescent X-ray spectroscopy (XPS) and electron probe X-ray microanalysis (EPMA) are also available.

[Composition and Resistance Varying Characteristic of First Tantalum Oxide Layer]

Next, a description will be made of the resistance varying characteristic in the case where the nonvolatile memory element 100 of this embodiment is formed by forming the resistance variable layer 106 using the tantalum oxide layer whose oxygen content rate is varied, as the first tantalum oxide layer 104. The same method as described in Embodiment 1 is used for manufacturing the nonvolatile memory element 100. To be specific, an oxide layer 102 having a thickness of 200 nm is formed on a single crystal silicon substrate 101 by the thermal oxidation process, and a Pt thin film having a thickness of 100 nm which is a first electrode layer 103 is formed on the oxide layer 102 by the sputtering process. Thereafter, a first tantalum oxide layer 104 is formed on the first electrode layer 103 by performing sputtering using tantalum as a target, under the condition in which the power is 250 W, the total gas pressure including argon gas and oxygen gas is 3.3 Pa, and the temperature of the substrate is set at 30° C. The respective examples were manufactured in such a way that the oxygen gas flow rate ratio is changed from 0.8% to 6.7% in the range of examination in this embodiment.

The sputtering time was adjusted so that the film thickness of the first tantalum oxide layer 104 was 30 nm. Thereafter, oxygen plasma was applied for 30 min to the uppermost surface of the first tantalum oxide layer 104 to form the second tantalum oxide layer 105. Finally, a Pt thin film having a thickness of 150 nm was formed as the second electrode layer 107 on the second tantalum oxide layer 105 by the sputtering process, completing the nonvolatile memory element 100.

Figure 17:
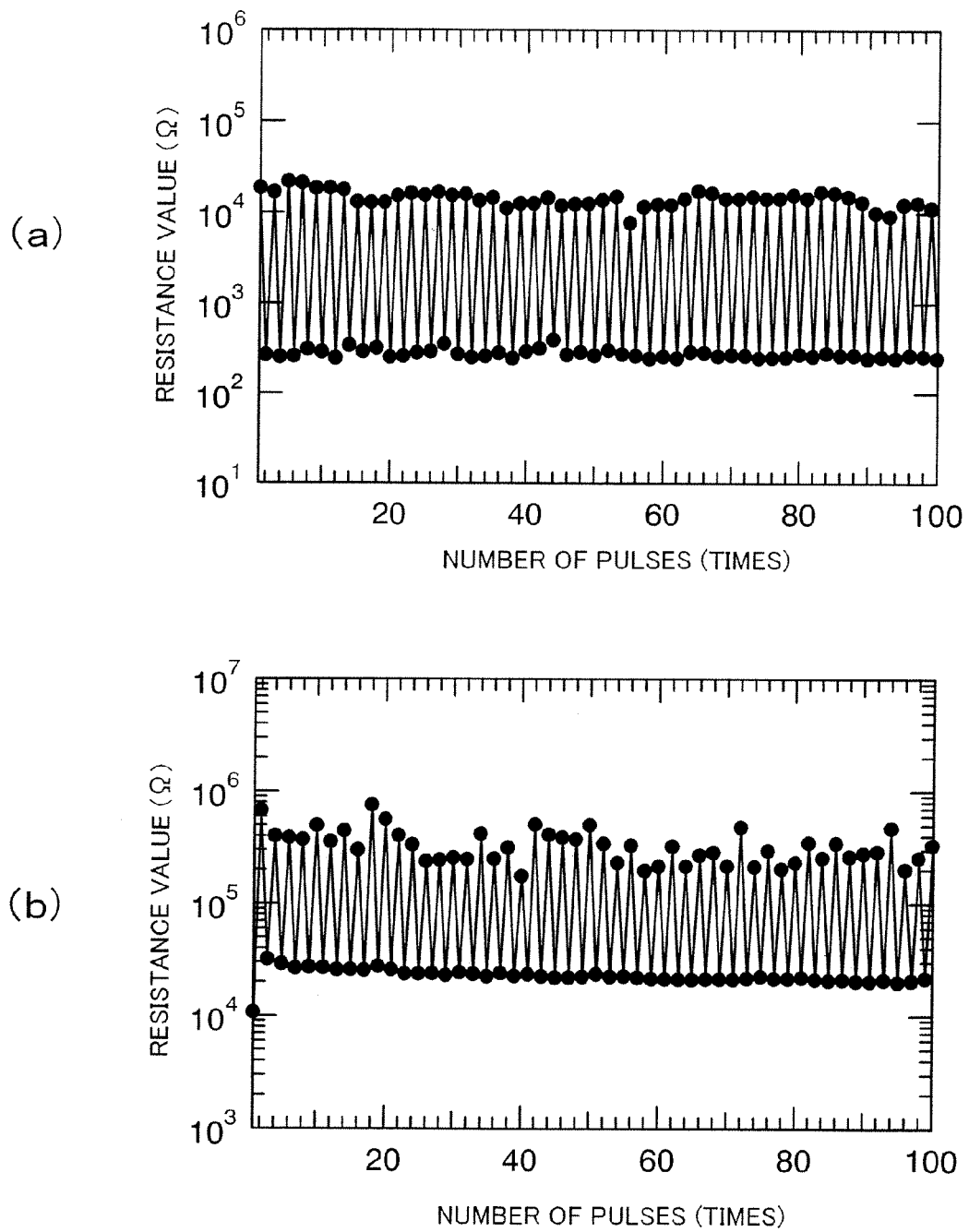
FIGS. 17(a) and 17(b) are views showing the relation between a resistance value of a resistance variable layer included in the nonvolatile memory element according to Embodiment 3 of the present invention, and the number of times of pulse applications.

The resistance varying phenomenon of the nonvolatile memory element manufactured as described above was measured. In the nonvolatile memory elements using the tantalum oxide films from α point (oxygen flow rate ratio: about 1.7%, oxygen content rate: about 45 at %) to β point (oxygen flow rate ratio: about 5%, oxygen content rate: 65 at %) shown in FIG. 16, a high-resistance value was desirably not less than five times as high as a low-resistance value. FIG. 17(b) and FIG. 17(b) show a measurement result of a resistance varying characteristic of the sample having the oxygen content rate at the α point with respect to the number of pulse applications and show a measurement result of a resistance varying characteristic of the sample having the oxygen content rate at the β point with respect to the number of pulse applications, respectively. As can be seen from FIGS. 17(b) and 17(c), in both of the oxygen content rate at the α point and the oxygen content rate at the β point, the high-resistance value is desirably not less than five times as high as the low-resistance value. Therefore, the composition range in which the oxygen content rate is 45 to 65 at %, i.e., the range of x, $0.8 \leq x \leq 1.9$ in the case where the resistance variable layer is represented by TaOx is a more appropriate range of the resistance variable layer (oxygen content rate=45 at % corresponds to x=0.8, and the oxygen content rate=65 at % corresponds to x=1.9). In the composition analysis according to the RBS method, the analysis value of the oxygen content has precision of about ±5 at %. Therefore, the composition range of x contains a measurement error associated with this precision, and in actuality, there may be a possibility that the composition range in which the oxygen content rate is 40 to 70 at % is this appropriate composition range. Even in the resistance variable layer outside the composition range, the resistance varying phenomenon is confirmed or presumably recognized. However, as compared to the resistance varying phenomenon of the resistance variable layer within this composition range, the resistivity is smaller or larger, and therefore the high-resistance value is considered to be less than five times as high as the low-resistance value. Therefore, it is supposed that the resistance variable layer outside the composition range makes stable operation of the memory element relatively difficult.

In Embodiment 1, as shown in FIG. 1, the resistance variable layer 106 is sandwiched between the first electrode layer 103 disposed therebelow and the second electrode layer 107 disposed thereabove, and the both ends of the resistance variable layer 106 conform to the both ends of the second electrode layer 107 when viewed in the cross section. However, this configuration is merely exemplary, and the present invention is not restricted thereto. Hereinafter, modifications thereof will be described.

Figure 18:
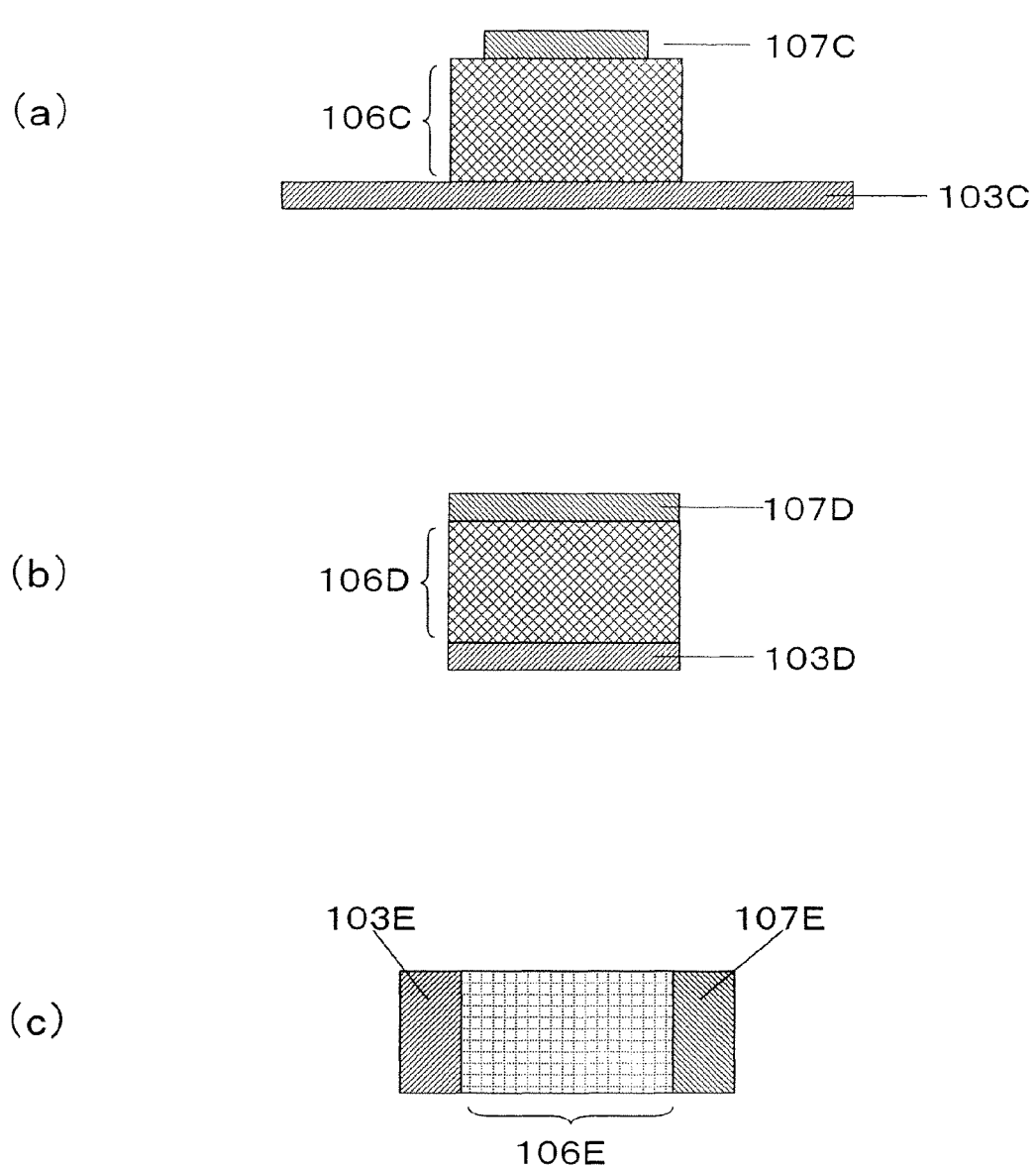
FIGS. 18(a) to 18(c) are cross-sectional views showing configurations of modifications of the nonvolatile memory elements according to Embodiments 1 to 3 of the present invention.

FIGS. 18(*a*) to 18(*c*) are cross-sectional views showing the configurations of modifications of the nonvolatile memory element according to Embodiment 1 of the present invention. In FIGS. 18(*a*) to 18(*c*), the substrates and the oxide layers are omitted for convenience. Further, the resistance variable layer comprising several tantalum oxide layers is illustrated as a single layer. Actually, this resistance variable layer has a layer structure as shown in FIG. 1 or FIG. 8.

The modification shown in FIG. 18(*a*) is configured so that a first electrode layer 103E, a resistance variable layer 103E, and a second electrode layer 107E are stacked in this order, and the both ends of the first electrode layer 103E, the resistance variable layer 106E, and the second electrode layer 107E do not conform to each other as viewed in the cross section. On the other hand, whereas the modification shown in FIG. 18(*b*) is also configured so that a first electrode layer 103E, a resistance variable layer 106E, and a second electrode layer 107E are stacked, the both ends of the first electrode layer 103E, the resistance variable layer 106E, and the second electrode layer 107E conform to each other as viewed in the cross section. The nonvolatile memory element of the present invention may be configured in this way.

Further, while the nonvolatile memory element 100 of this embodiment and the two modifications are each configured so that the resistance variable layer is sandwiched between the electrodes located above and below, the electrodes may be formed at the both edge surfaces of the resistance variable layer to enable a current to flow in the direction parallel to a main surface of the resistance variable layer. That is, as shown in FIG. 18(*c*), a first electrode layer 103E may be formed on one edge surface of a resistance variable layer 104E while a second electrode layer 107E may be formed on the other edge surface thereof to enable a current to flow in the direction parallel to a main surface of a resistance variable layer 106F.

By the way, the nonvolatile memory element of this embodiment includes an interlayer insulation layer, although not shown. A fluorine-doped oxide film may be formed by chemical vapor deposition or the like to be used as the interlayer insulation layer. Alternatively, this interlayer insulation layer may be dispensed with.

Further, the nonvolatile memory element of this embodiment includes a wire layer, although not shown. As wire material, for example, Pt, Ir, Pd, Ag, Au, Cu, W, Ni, or Ti-nitride may be used. Alternatively, this wire layer may be dispensed with.

The sputtering conditions including the partial pressure ratio of oxygen gas in Embodiments 1 to 3 are not restricted to those values described above, but are changed depending on the configuration and state of the apparatus. Further, while Ta is used as a target for the deposition of the first tantalum oxide layer, a sputtering process using no reactive gas such as oxygen may be employed by using a tantalum oxide as a target. The power, the gas pressure, the substrate temperature and others during sputtering are not restricted to those described above. Moreover, the first tantalum oxide layer may be formed using a film-formation technique such as chemical vapor deposition.

While in Embodiments 1 and 2 the second tantalum oxide layer is formed by oxygen plasma treatment and oxidation, other methods such as oxidation using ozone, natural oxidation in air, oxidation utilizing a reaction with molecules of water or the like adsorbed to the substrate, etc., may alternatively be employed. In a further alternative, the second tantalum oxide layer itself may be formed using a film formation technique such as sputtering or chemical vapor deposition.

(Embodiment 4)

The nonvolatile memory elements according to the above described Embodiments 1 to 3 are applicable to various types of nonvolatile semiconductor apparatuses. A semiconductor apparatus according to Embodiment 4 is a nonvolatile semiconductor apparatus including a nonvolatile memory element according to any one of Embodiments 1 to 3, and is of a so-called cross-point type in which active layers intervene at intersection points (three-dimensional cross points) between word lines and bit lines.

[Configuration of Semiconductor Apparatus According to Embodiment 4]

Figure 19:
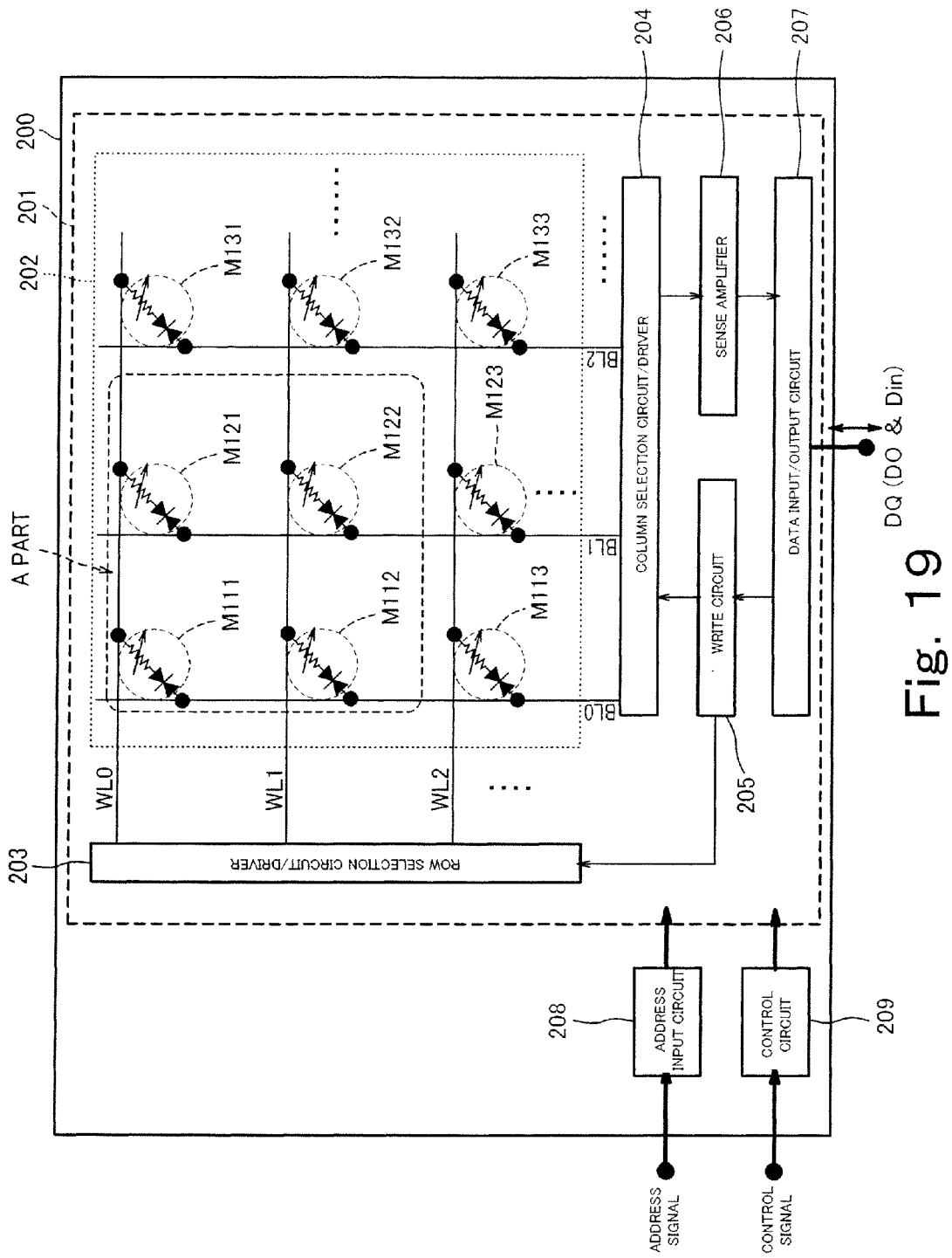
FIG. 19 is a block diagram showing a configuration of a nonvolatile semiconductor apparatus according to Embodiment 4 of the present invention.
Figure 20:
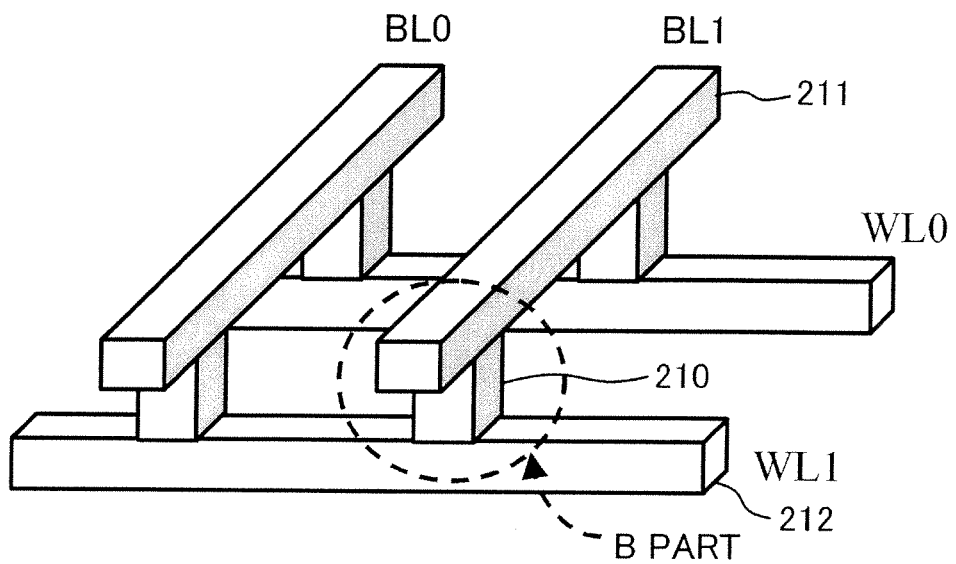
FIG. 20 is a perspective view showing a configuration of A part (configuration corresponding to four bits) in FIG. 19.

FIG. 19 is a block diagram showing the configuration of the nonvolatile semiconductor apparatus according to Embodiment 4 of the present invention. FIG. 20 is a perspective view showing the configuration of A part (configuration corresponding to four bits) in FIG. 19.

As shown in FIG. 19, a nonvolatile semiconductor apparatus 200 of this embodiment has a memory main body 201 on a semiconductor substrate, and the memory main body 201 includes a memory array 202, a row selection circuit/driver 203, a column selection circuit/driver 204, a write circuit 205 for writing data, a sense amplifier 206 for detecting the amount of a current which flows in a selected bit line, and determining it as data "1" or "0", and a data input/output circuit 207 for performing input/output processing of input/output data through a terminal DQ. The nonvolatile semiconductor apparatus 200 further includes an address input circuit 208 for receiving an address signal externally input, and a control circuit 209 for controlling the operation of the memory main body 201 based on the externally input control signal.

As shown in FIGS. 19 and 20, the memory array 202 includes a plurality of word lines WL0, WL1, WL2, . . . which are formed to extend in parallel with each other on the semiconductor substrate, and a plurality of bit lines BL0, BL1, BL2, . . . which are formed above the plurality of word lines WL0, WL1, WL2, . . . so as to extend in parallel with each other within a plane parallel to a main surface of the semiconductor substrate, and so as to three-dimensionally cross the plurality of word lines WL0, WL1, WL2, . . . .

In addition, a plurality of memory cells M111, M112, M113, M121, M122, M123, M131, M132, M133, . . . (hereinafter referred to as "memory cells M111, M112, . . . ") are disposed in matrix, to respectively correspond to the three-dimensional cross-points between the plurality of word lines WL0, WL1, WL2, . . . and the plurality of bit lines BL0, BL1, B2, . . . .

Each of the memory cells M111, M112, . . . corresponds to the nonvolatile memory element according to Embodiment 1, and has the resistance variable layer including the tantalum oxide. Note that, in this embodiment, each of the memory cells M111, M112, . . . has a current restricting element as described later.

The memory cells M111, M112, . . . shown in FIG. 19 are denoted by a reference numeral 210 in FIG. 20.

The address input circuit 208 receives an address signal from an external circuit (not shown), and outputs a row address signal and a column address signal to the row selection circuit/driver 203 and the column selection circuit/driver 204, respectively, based on the address signal. The address signal is a signal indicating the address of a specific memory cell to be selected from among the plurality of memory cells M111, M112, . . . . The row address signal is a signal indicating a row address of the addresses indicated by the address signal, and the column address signal is a signal indicating a column address of the addresses indicated by the address signal.

In a data write cycle, the control circuit 209 outputs a write signal for causing application of a write voltage, to the write circuit 205, in accordance with input data Din input to the data input/output circuit 207. On the other hand, in a data readout cycle, the control circuit 209 outputs a readout signal for causing application of a readout voltage, to the column selection circuit/driver 204.

The row selection circuit/driver 203 receives the row address signal output from the address input circuit 208, selects any one of the plurality of word lines WL0, WL1, WL2, . . . according to the row address signal, and applies a predetermined voltage to the selected word line.

The column selection circuit/driver 204 receives the column address signal output from the address input circuit 208, selects any one of the plurality of bit lines BL0, BL1, BL2, . . . according to the column address signal, and applies the write voltage or the readout voltage to the selected bit line.

Receiving the write signal output from the control circuit 209, the write circuit 205 outputs to the row selection circuit/driver 203, a signal which causes the row selection circuit/driver 203 to apply the voltage to the selected word line, and outputs to the column selection circuit/driver 204, a signal which causes the column selection circuit/driver 204 to apply the write voltage to the selected bit line.

Further, in the data readout cycle, the sense amplifier 206 detects the amount of current which flows in the selected bit line which is a readout target, and determines it as data "1" or "0". The resulting output data DO is output to the external circuit through the data input/output circuit 207.

[Configuration of Nonvolatile Memory Element Included in Nonvolatile Semiconductor Apparatus According to Embodiment 4]

Figure 21:
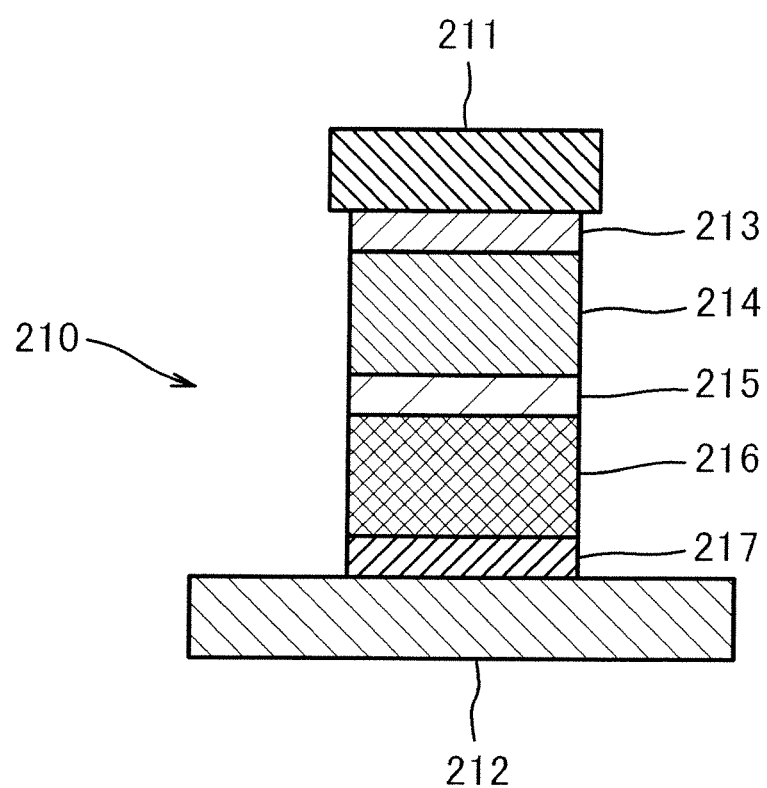
FIG. 21 is a cross-sectional view showing a configuration of a nonvolatile memory element included in the nonvolatile semiconductor apparatus according to Embodiment 4 of the present invention.

FIG. 21 is a cross-sectional view showing the configuration of the nonvolatile memory element included in the nonvolatile semiconductor apparatus according to Embodiment 4 of the present invention. Note that FIG. 21 shows the configuration of B part in FIG. 20.

As shown in FIG. 21, a nonvolatile memory element 210 included in the nonvolatile semiconductor apparatus of this embodiment is disposed between a lower wire 212 as a copper wire (corresponding to the word line WL1 in FIG. 20) and an upper wire 211 (corresponding to the bit line BL1 in FIG. 20), and comprises a lower electrode 217, a current restricting element 216, an inner electrode 215, a resistance variable layer 214, and an upper electrode 213 which are stacked in this order.

The inner electrode 215, the resistance variable layer 214, and the upper electrode 213 correspond to the first electrode layer 103, the resistance variable layer 106, and the second electrode layer 105 in the nonvolatile memory element 100 according to Embodiments 1 to 3 shown in FIGS. 1 and 20, respectively. Therefore, the resistance variable layer 214 is formed in a similarly manner to that described in Embodiments 1 to 3.

The current restricting element 216 is connected in series to the resistance variable layer 214 through the inner electrode 215. This current restricting element 216 is an element typified by a diode, and has a nonlinear current characteristic with respect to the voltage. In addition, the current restricting element 216 has a bidirectional current characteristic with respect to the voltage, and is configured to be placed in a conductive state under a predetermined threshold voltage Vf (for example, +1V or more, or −1V or less based on one electrode as a reference).

Tantalum and its oxide are materials generally used for the semiconductor process, and have very high affinity with the semiconductor process. Therefore, these materials can be easily incorporated in the existing semiconductor manufacturing process.

[Configuration of Modification of Nonvolatile Memory Element Included in Nonvolatile Semiconductor Apparatus According to Embodiment 4]

The configuration of the nonvolatile memory element included in the nonvolatile semiconductor apparatus of this embodiment is not limited to that shown in FIG. 21, and the nonvolatile memory element may be configured as follows.

FIGS. 22(a) to 22(g) are cross-sectional views showing the configurations of modifications of the nonvolatile memory element included in the nonvolatile semiconductor apparatus according to Embodiment 4 of the present invention.

Figure 22:
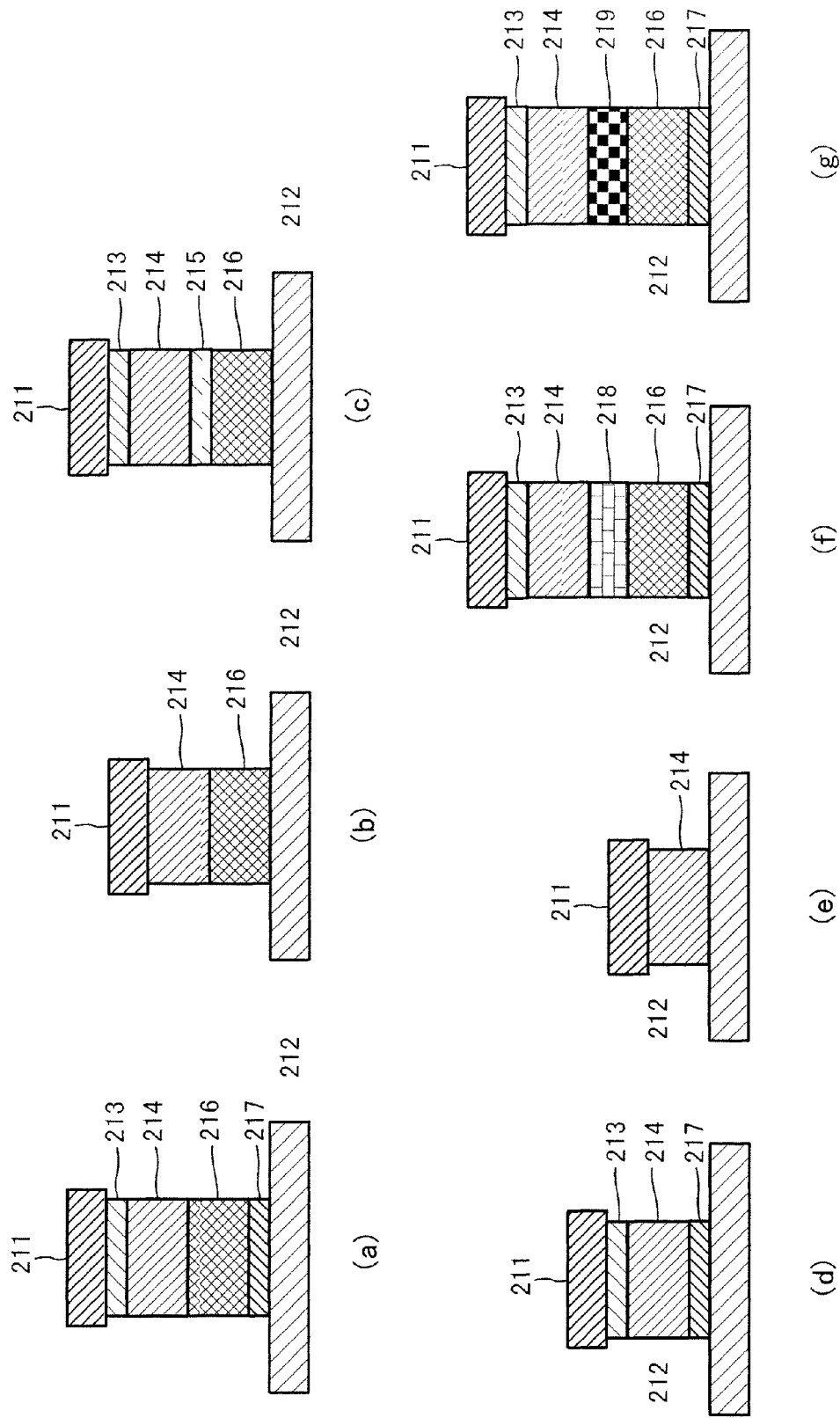
FIGS. 22(a) to 22(g) are cross-sectional views showing configurations of modifications of the nonvolatile memory element included in the nonvolatile semiconductor apparatus according to Embodiment 4 of the present invention.

FIG. 22(a) shows the configuration in which the inner electrode is not provided, and the resistance variable layer 214 is formed on the current restricting element 216, unlike the configuration shown in FIG. 21.

FIG. 22(b) shows the configuration in which the lower electrode, the inner electrode, and the upper electrode are not provided, and the resistance variable layer 214 is formed on the current restricting element 216, unlike the configuration shown in FIG. 21. Further, FIG. 22(c) shows the configuration in which the lower electrode is not provided unlike the configuration shown in FIG. 21. Alternatively, a configuration having no upper electrode is also conceivable although not shown.

FIG. 22(d) shows the configuration in which the inner electrode and the current restricting element are not provided, and FIG. 22(e) shows the configuration in which the upper electrode and the lower electrode are further not provided, unlike the configuration shown in FIG. 21.

FIG. 22(f) shows the configuration in which the inner electrode is not provided, but instead an ohmic resistance layer 218 is provided, and FIG. 22(g) shows the configuration in which a second resistance variable layer 219 is provided instead of the inner electrode, unlike the configuration shown in FIG. 21.

In the above described modifications, when the upper electrode is not provided, the upper wire 211 serves as an upper electrode of the nonvolatile memory element. When the lower electrode is not provided, the lower wire 212 serves as a lower electrode of the nonvolatile memory element.

When the number of the memory cells is relatively small, a crosstalk current to the unselected memory cells is reduced. In such case, the above described current restricting element may be omitted.

As described above, various configurations of the nonvolatile memory element included in the nonvolatile semiconductor apparatus according to this embodiment are conceivable.

[Example of Configuration of Multilayer-Structure Nonvolatile Semiconductor Apparatus]

It is possible to attain a multilayer-structure nonvolatile semiconductor apparatus by three-dimensionally stacking the memory arrays included in the nonvolatile semiconductor apparatuses according to this embodiment shown in FIG. 19 and FIG. 20.

Figure 23:
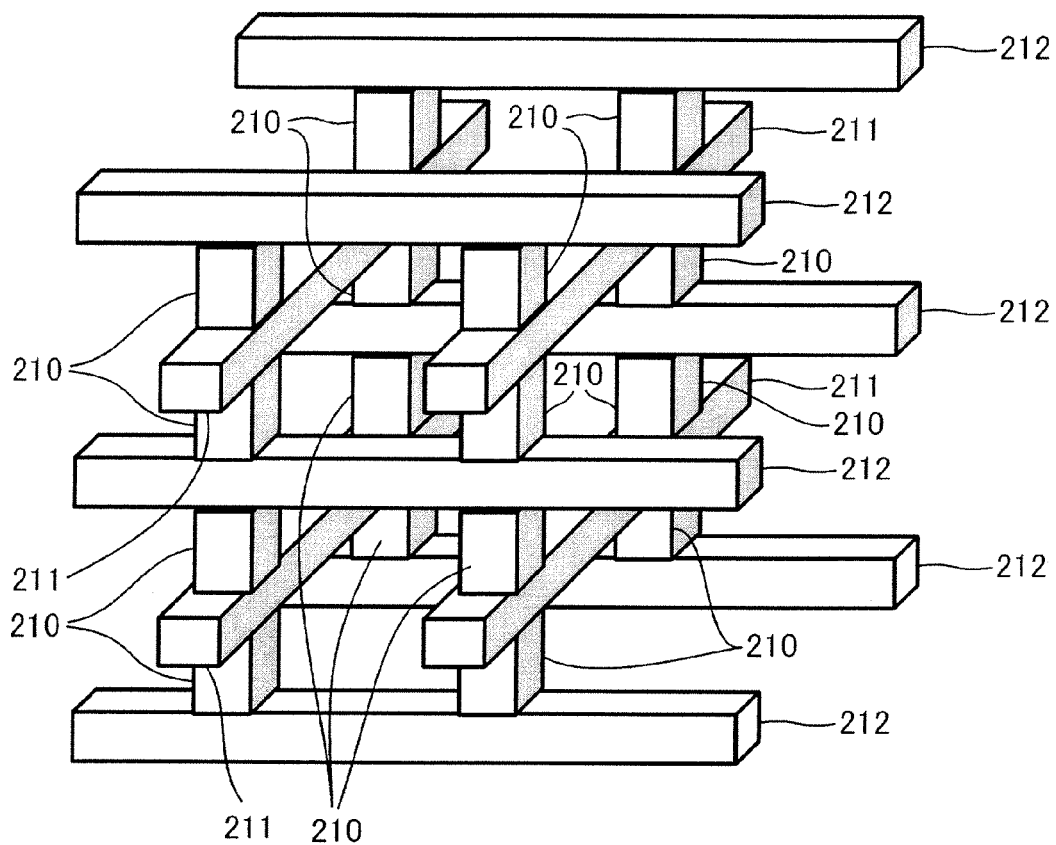
FIG. 23 is a perspective view showing a configuration of a memory array included in a multi-layer structure nonvolatile semiconductor apparatus according to the present invention.

FIG. 23 is a perspective view showing the configuration of memory arrays included in the multilayer-structure nonvolatile semiconductor apparatus of the present invention. As shown in FIG. 23, this nonvolatile semiconductor apparatus includes a multi-layer memory array obtained by stacking a plurality of memory arrays to form a layered structure, each memory array comprising a plurality of lower wires 212 which are formed to extend in parallel with each other on the semiconductor substrate (not shown), a plurality of upper wires 212 which are formed above the plurality of lower wires 212 so as to extend in parallel with each other within a plane parallel to the main surface of the semiconductor substrate, and so as to three-dimensionally cross the plurality of lower wires 212, and a plurality of memory cells 210 which are disposed in matrix to respectively correspond to the three-dimensional cross-points between the plurality of lower wires 212 and the plurality of upper wires 211.

While in the example shown in FIG. 23 there are provided five wire layers and four layers of nonvolatile memory elements disposed at the three-dimensional cross-points of the wire layers, it is a matter of course that the numbers of these layers and elements may be increased or decreased as desired.

An ultra-high capacity nonvolatile memory is attainable by providing the multi-layer memory arrays thus configured.

As already described in Embodiments 1 to 3, the resistance variable layer of the present invention can be formed at a low temperature. Therefore, even when the layered structure is formed in the wiring process as shown in this embodiment, transistors or wire material such as silicide formed in the lower-layer step are not affected, and therefore, the multi-layer memory array can be easily attained. That is, the multilayer-structure nonvolatile semiconductor apparatus can be easily attained by using the resistance variable layer including the tantalum oxide according to the present invention.

[Example of Operation of Nonvolatile Semiconductor Apparatus]

Next, a description will be made of an example of the operation of the nonvolatile semiconductor apparatus according to Embodiment 4 in the write cycle for writing data and in the readout cycle for reading out data, with reference to a timing chart shown in FIG. 24.

Figure 24:
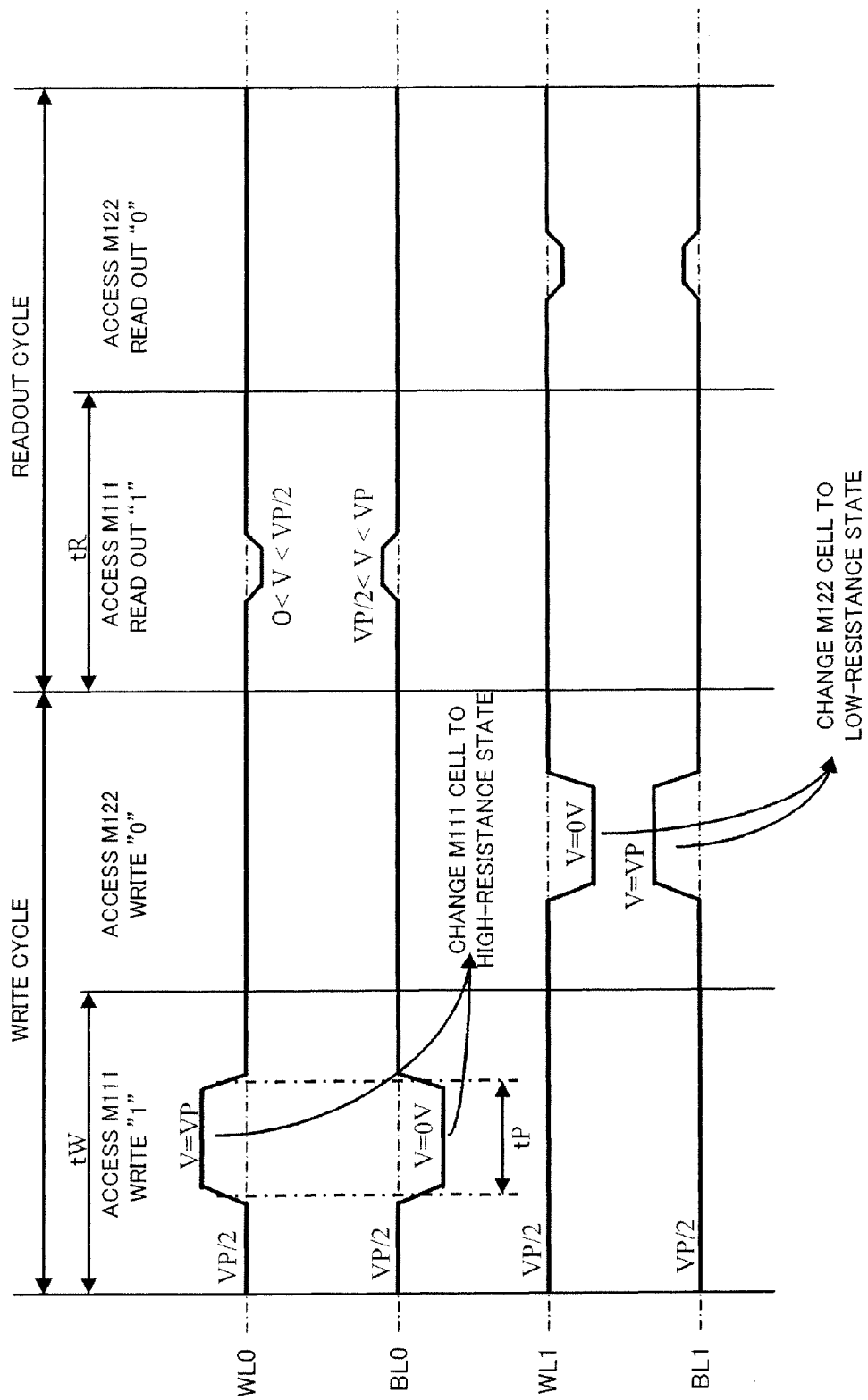
FIG. 24 is a timing chart showing an example of an operation of the nonvolatile semiconductor apparatus according to Embodiment 4 of the present invention.

FIG. 24 is a timing chart showing the example of the operation of the nonvolatile semiconductor apparatus according to Embodiment 4 of the present invention. Illustrated herein is the example of operation in which an event that the resistance variable layer is in the high-resistance state is allocated to data "1" and an event that the resistance variable layer is in the low-resistance state is allocated to data "0." For the convenience of explanation, writing and reading out of data with respect to only the memory cells M111 and M112 are described.

VP in FIG. 24 denotes a pulse voltage required to enable the memory cell including the resistance variable element and the current restricting element to change its resistance. It is desired that a relationship VP/2<threshold voltage Vf be established. This is because, this relationship can suppress a leak current flowing to an unselected memory cell due to crosstalk. This makes it possible to reduce a current supplied to a memory cell which does not require writing of data, facilitating achievement of low electric power consumption. In addition, unintended superficial writing (generally referred to as disturb) to the unselected memory cell is advantageously suppressed.

In FIG. 24, tW denotes a write cycle time which is a time required for one write cycle, and tR denotes a readout cycle time which is a time required for one readout cycle.

In a write cycle for the memory cell M111, a pulse voltage VP having a pulse width tP is applied to the word line WL0, and according to this timing, a voltage of 0V is applied to the bit line BL0 in the same manner. In this way, a write voltage for writing data "1" is applied to the memory cell M111, causing the resistance variable layer in the memory cell M111 to be turned to the high-resistance state. That is, the data "1" is written to the memory cell M111.

Then, in a write cycle for the memory cell M122, a voltage of 0V having a pulse width tP is applied to the word line WL1, and according to this timing, the pulse voltage VP is applied to the bit line BL1 in the same manner. In this way, a write voltage for writing data "0" is applied to the memory cell M122, causing the resistance variable layer in the memory cell M122 to be turned to the low-resistance state. That is, the data "0" is written to the memory cell M122.

In a readout cycle for the memory cell M111, a pulse voltage which has an amplitude smaller than that of the pulse for writing and has a value larger than 0V and smaller than VP/2 is applied to the word line WL0. According to this timing, a pulse voltage which has an amplitude smaller than that of the pulse for writing and has a value larger than VP/2 and smaller than VP is applied to the bit line BL0. Thereby, a current corresponding to the resistance value of the resistance variable layer 214 in the memory cell M111 turned to the high-resistance state is output, and its output current value is detected, so that the data "1" is read out.

Then, in a readout cycle for the memory cell M122, a voltage identical to that in the previous readout cycle for the memory cell M111 is applied to the word line WL1 and the bit line BL1. Thereby, a current corresponding to the resistance value of the resistance variable layer 214 in the memory cell M122 turned to the low-resistance state is output, and its output current value is detected, so that the data "0" is read out.

As already described in Embodiment 1, in the case where the resistance variable layer including the tantalum oxide of the present invention is used, the resistance varying phenomenon can be confirmed even when the electric pulses applied between the electrodes is a high-speed pulse having a width of about 20 nsec. Therefore, the pulse width tP may be set to about 50 nsec.

Since the high-speed pulse having a pulse width of about 50 nsec can be used, one write cycle time tW can be set to about 80 nsec, taking operation time of a peripheral circuit such as a control circuit of the nonvolatile semiconductor apparatus 200 into account. In that case, for example, when input/output of data to/from a component outside the nonvolatile semiconductor apparatus 200 via the terminal DQ of the data input/output circuit 207, is performed with 16 bits, a data transfer speed required for writing the data is 25 Mbite per second, achieving a very high-speed write operation. Furthermore, a higher-speed write operation can be achieved by increasing parallel write bits in number inside the nonvolatile semiconductor apparatus, by using a known method such as a page mode or a burst mode.

Among conventional nonvolatile memories, in the case of a NAND flash memory which is known to be capable of data transfer at a relatively high speed, a data transfer speed required for writing is about 10 Mbites per second, even if the page mode is used. From this fact, achievement of the high-speed of the write operation of the nonvolatile semiconductor apparatus according to this embodiment can be confirmed.

As already described in Embodiment 1, by using the resistance variable layer including the tantalum oxide of the present invention, the nonvolatile memory element which has a low imprinting characteristic can be attained. To be specific, even in the case where, after the same data is repeatedly written, opposite data is written, rewriting can be performed by applying a high-speed pulse once. This eliminates a need for a step for adjusting different data to identical ones before writing, which commonly occurs in a delete cycle or a reset cycle which is typically needed in the nonvolatile memory element. This contributes to achievement of a higher-speed of the writing in the nonvolatile semiconductor apparatus according to this embodiment. Since such a step is dispensed with, the write operation can be performed with a simple step.

Since a voltage which is as low as 2 to 3V is sufficient as the write voltage, low electric power consumption can be realized.

In this embodiment, only the cross-point structure formed by integration on the semiconductor substrate is described. Alternatively, the cross-point structure may be fanned on a more inexpensive substrate such as a plastic substrate, in place of the semiconductor substrate, and may be applied to a memory apparatus which has a layered structure formed by an assembling method using bumps.

(Embodiment 5)

The nonvolatile memory elements according to the above Embodiments 1 to 3 are applicable to nonvolatile semiconductor apparatuses having various configurations. A nonvolatile semiconductor apparatus according to Embodiment 5 is a nonvolatile semiconductor apparatus including a nonvolatile memory element according to any one of Embodiments 1 to 3, which is of a so-called 1T1R type including one transistor/one nonvolatile memory portion.

[Configuration of Nonvolatile Semiconductor Apparatus According to Embodiment 5]

Figure 25:
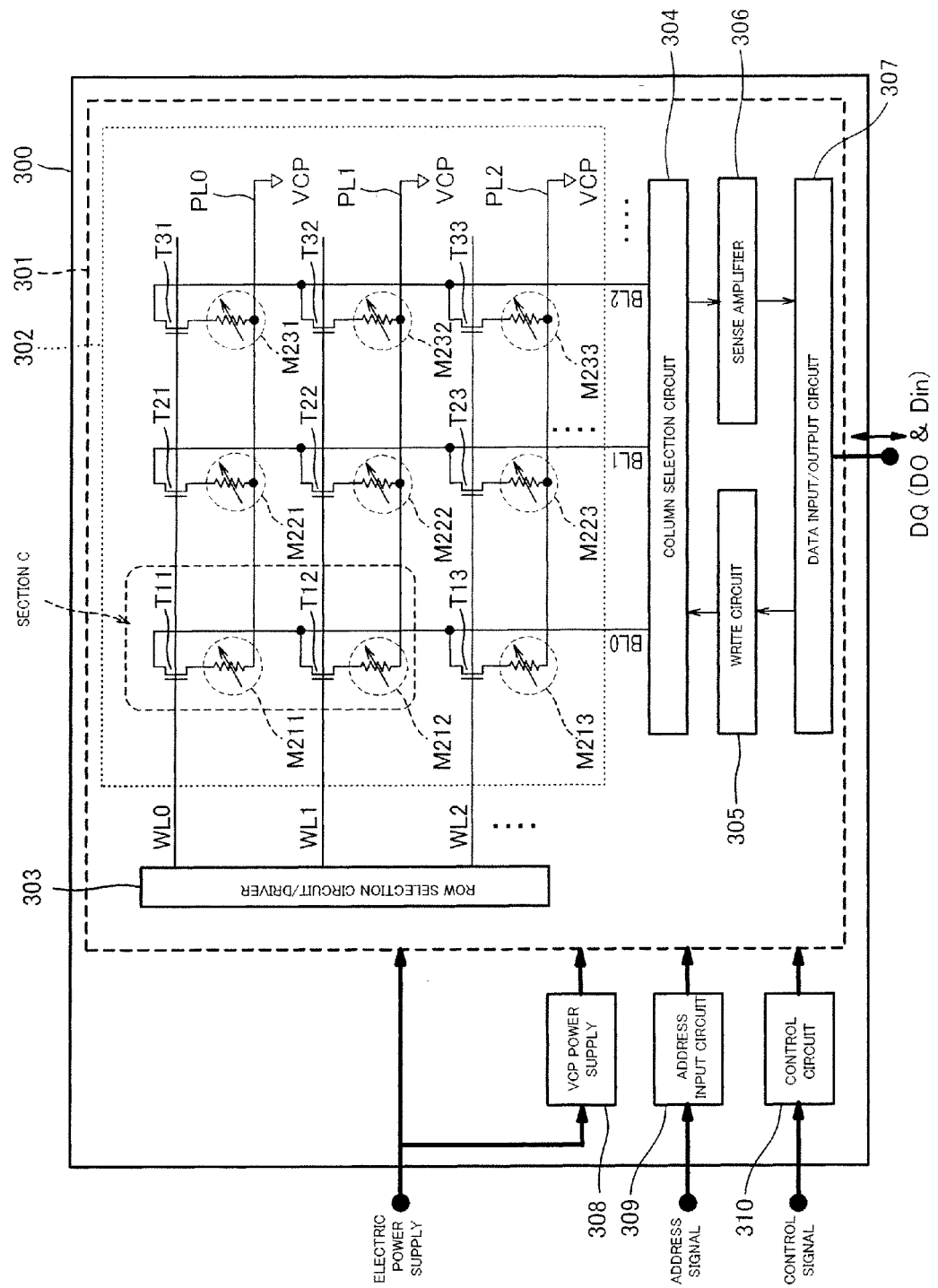
FIG. 25 is a block diagram showing a configuration of a nonvolatile semiconductor apparatus according to Embodiment 5 of the present invention.
Figure 26:
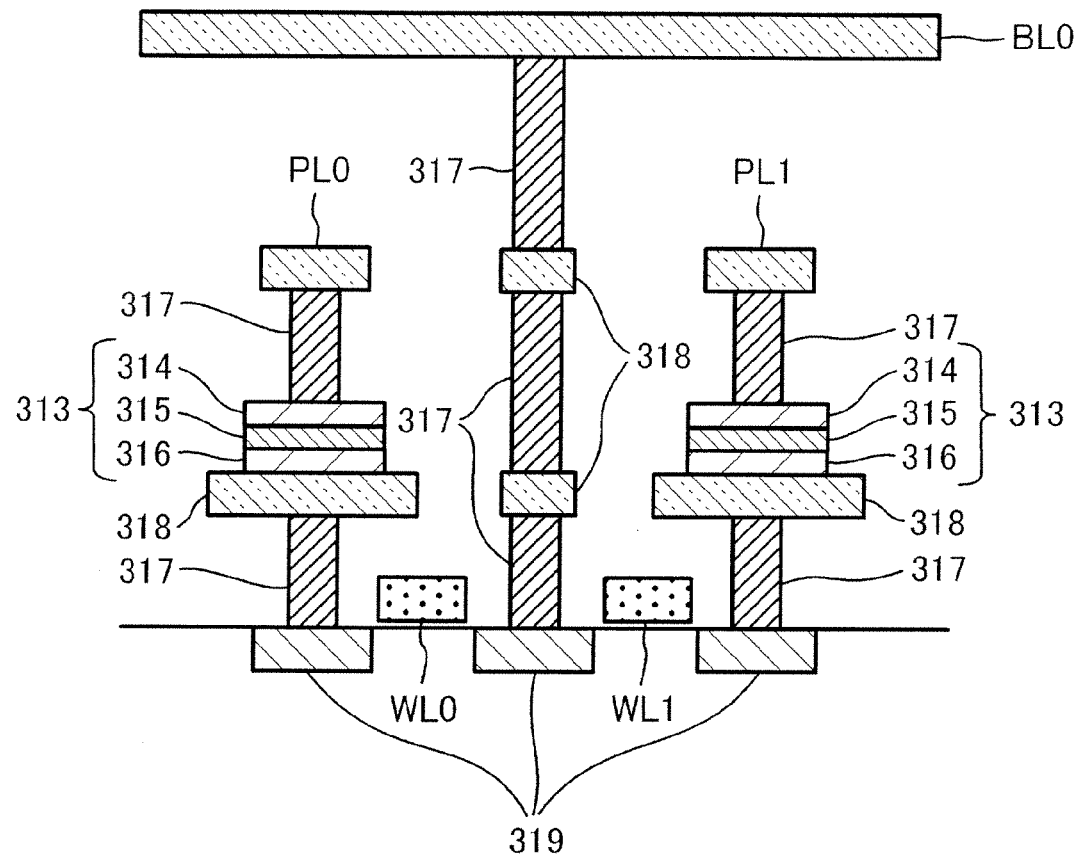
FIG. 26 is a cross-sectional view showing a configuration of C part (configuration corresponding to two bits) in FIG. 25.

FIG. 25 is a block diagram showing a configuration of a nonvolatile semiconductor apparatus according to Embodiment 5 of the present invention. FIG. 26 is a cross-sectional view showing a configuration (configuration corresponding to 2 bits) in C part of FIG. 25.

As shown in FIG. 25, a nonvolatile semiconductor apparatus 300 according to this embodiment includes a memory main body 301 on a semiconductor substrate. The memory main body 301 includes a memory array 302, a row selection circuit/driver 303, a column selection circuit 304, a write circuit 305 for writing data, a sense amplifier 306 for detecting an amount of a current flowing in a selected bit line and determines the data as "1" or "0," and a data input/output circuit 307 for performing input/output processing of input/output data via the terminal DQ. The nonvolatile semiconductor apparatus 300 further includes a cell plate electric power supply (VCR electric power supply) 308, an address input circuit 309 which receives an address externally input, and a control circuit 310 for controlling the operation of the memory main body 301, based on the control signal externally input.

The memory array 302 includes the plurality of word lines WL0, WL1, WL2, . . . and the plurality of bit lines BL0, BL1, BL2, . . . which are formed on the semiconductor substrate and are arranged to three-dimensionally cross each other, a plurality of transistors T11, T12, T13, T21, T22, T23, T31, T32, T33, . . . (hereinafter represented by "transistors T11, T12, . . . ") provided to respectively correspond to intersections of the word lines WL0, WL1, WL2, . . . and the bit lines BL0, BL1, BL2, . . . , and a plurality of memory cells M211, M212, M213, M221, M222, M223, M231, M232, N233 (hereinafter expressed as "memory cells M211, M212, . . . " provided to respectively correspond to the transistors T11, T12, . . . .

The memory array 302 further includes a plurality of plate lines PL0, PL1, PL2, . . . which are arranged to extend in parallel with the word lines WL0, WL1, WL2, . . . .

As shown in FIG. 26, the bit line BL0 is disposed above the word lines WL0 and WL1, and the plate lines PL0 and PL1 are disposed between the word lines WL0 and WL1 and the bit line BL0.

Each of the memory cells M211, M212, . . . corresponds to the nonvolatile memory elements according to Embodiment 1 to Embodiment 3, and includes a resistance variable layer comprising tantalum oxide. To be specific, the nonvolatile memory element 313 in FIG. 26 corresponds to the memory cells M211, M212, . . . in FIG. 25, and is constituted by the upper electrode 314, the resistance variable layer 315 comprising tantalum oxide, and the lower electrode 316.

In FIG. 26, 317 denotes a plug layer, 318 denotes a metal wire layer, and 319 denotes source/drain regions.

As shown in FIG. 25, drains of the transistors T11, T12, T13, . . . are connected to the bit line BL0, drains of the transistors T21, T22, T23, . . . are connected to the bit line BL1, and drains of the transistors T31, T32, T33, . . . are connected to the bit line BL2.

Gates of the transistors T11, T21, T31, . . . are connected to the word line WL0, gates of the transistors T12, T22, T32, . . . are connected to the word line WL1, and gates of the transistors T13, T23, T33, . . . are connected to the word line WL2.

Sources of the transistors T11, T12, . . . are connected to the memory cells M211, M212, . . . , respectively.

The memory cells M211, M221, M231, . . . are connected to the plate line PL0, the memory cells M212, M222, M232, . . . are connected to the plate line PL1, and the memory cells M213, M223, M233, . . . are connected to the plate line PL2.

The address input circuit 309 receives an address signal from an external circuit (not shown), and outputs a row address signal and a column address signal to the row selection circuit/driver 303 and the column selection circuit 304, respectively, based on the address signal. The address signal is a signal indicating the address of a specified memory cell to be selected from among the plurality of memory cells M211, M212, . . . . The row address signal is a signal indicating the address of a row in the address indicated by the address signal, and the column address signal is a signal indicating the address of a column in the address indicated by the address signal.

In a data write cycle, the control circuit 310 outputs to the write circuit 305, a write signal for causing application of a write voltage, according to the input data Din input to the data input/output circuit 307. On the other hand, in a data readout cycle, the control circuit 310 outputs to the column selection circuit 304, a readout signal for causing application of a readout voltage.

The row selection circuit/driver 303 receives the row address signal output from the address input circuit 309, selects any one from among the plurality of word lines WL0, WL1, WL2, . . . according to the row address signal, and applies a predetermined voltage to the selected word line.

The column selection circuit 304 receives a column address signal output from the address input circuit 309, selects any one from among the plurality bit lines BL0, BL1, BL2, . . . according to the column address signal, and applies the write voltage or the readout voltage to the selected bit line.

Receiving the write signal output from the control circuit 310, the write circuit 305 outputs to the column selection circuit 304, a signal for causing application of the write voltage to the selected bit line.

In the data readout cycle, the sense amplifier 306 detects an amount of a current flowing in the selected bit line which is a readout target, and determines the data as "1" or "0." The resulting output data DO is output to the external circuit via the data input/output circuit 307.

In Embodiment 5 using the configuration of one transistor/one nonvolatile memory portion, a storage capacity is smaller than that of the configuration using the cross-point type nonvolatile memory portion in Embodiment 4. However, Embodiment 5 may dispense with the current restricting element such as the diode, and therefore is advantageously easily combined with the CMOS process. In addition, operation control therefor is advantageously easy.

As in Embodiment 4, the resistance variable layer of the present invention can be formed at a low temperature. Therefore, it is advantageous that transistors or wire material such as silicide formed in a lower layer step are not affected even when forming a layered structure is performed in a wiring step illustrated in this embodiment.

Furthermore, as in Embodiment 4, since film forming of tantalum and its oxide are easily incorporated into the existing semiconductor manufacturing process, the nonvolatile semiconductor apparatus of this embodiment can be easily manufactured.

[Example of Operation of Nonvolatile Semiconductor Apparatus]

Subsequently, an example of the operation of the nonvolatile semiconductor apparatus according to Embodiment 5 in a write cycle for writing data and in a readout cycle for reading out data, will be described with reference to a timing chart shown in FIG. 27.

Figure 27:
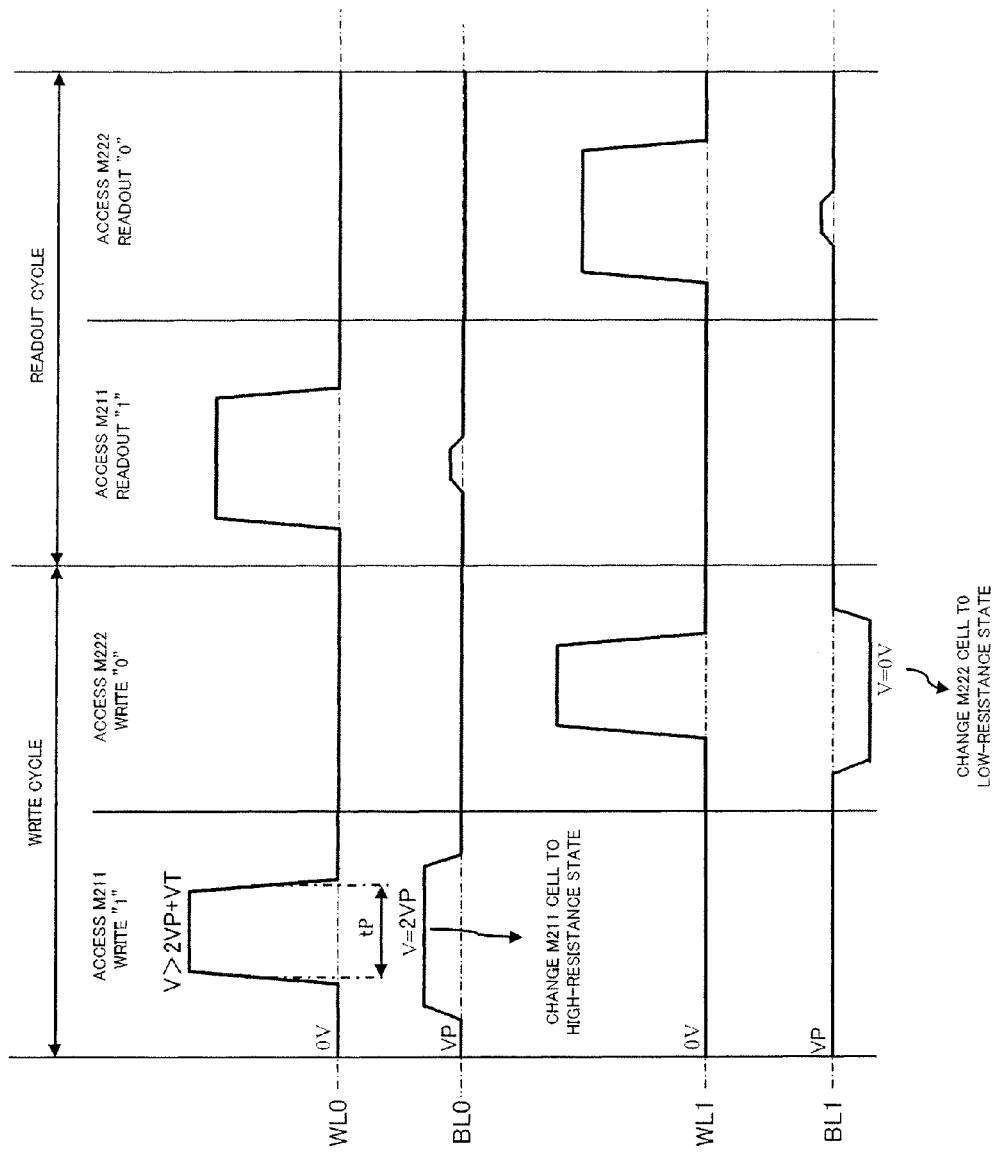
FIG. 27 is a timing chart showing an example of an operation of the nonvolatile semiconductor apparatus according to Embodiment 5 of the present invention.

FIG. 27 is a timing chart showing an example of the operation of the nonvolatile semiconductor apparatus according to Embodiment 5 of the present invention. Illustrated herein is the example of operation in which an event that the resistance variable layer is in the high-resistance state is allocated to data "1" and an event that the resistance variable layer is in the low-resistance state is allocated to data "0." For the convenience of explanation, writing and reading out of data with respect to the memory cells M211 and M212 are shown.

In FIG. 27, VP denotes a pulse voltage required to enable the resistance variable element to change its resistance, and VT denotes a threshold voltage of the transistor. The voltage VP is always applied to the plate line, and the bit line is precharged with a voltage VP when it is unselected.

In a write cycle for the memory cell M211, a voltage which is larger than a pulse voltage 2VP+transistor threshold voltage VT and has a pulse width tP is applied to the word line WL0, causing the transistor T11 to be tuned on. According to this timing, a pulse voltage 2VP is applied to the bit line BL0. In this way, a write voltage for writing data "1" is applied to the memory cell M211, causing the resistance variable layer in the memory cell M211 to be turned to the high-resistance state. That is, the data "1" is written to the memory cell M211.

Then, in a write cycle for the memory cell M222, a voltage which is larger than a pulse voltage 2VP+transistor threshold voltage VT and has a pulse width tP is applied to the word line WL1, causing the transistor T22 to be tuned on. According to this timing, a voltage of 0V is applied to the bit line BL1. In this way, a write voltage for writing data "0" is applied to the memory cell M222, causing the resistance variable layer in the memory cell M222 to be turned to the low-resistance state. That is, the data "0" is written to the memory cell M222.

In a readout cycle for the memory cell M211, a predetermined voltage for turning on the transistor T11 is applied to the word line WL0, and according to the timing, a pulse voltage having an amplitude smaller than that of the pulse width for writing is applied to the bit line BL0. Thereby, a current corresponding to the resistance value of the resistance variable layer of the memory cell M211 turned to the high-resistance state is output, and its output current value is detected, so that the data "1" is read out.

Then, in a readout cycle for the memory cell M222, a voltage identical to that in the previous readout cycle for the memory cell M211 is applied to the word line WL1 and the bit line BL1. Thereby, a current corresponding to the resistance value of the resistance variable layer in the memory cell M222 turned to the low-resistance state is output, and its output current value is detected, so that the data "0" is read out.

As in Embodiment 4, in this embodiment, a write operation is carried out by using a high-speed pulse.

As already described in Embodiment 4, by using the resistance variable layer comprising the tantalum oxide of the present invention, the nonvolatile memory element which has a low imprinting characteristic can be attained. This eliminates a need for a step such as a delete cycle or a reset cycle in the nonvolatile semiconductor apparatus according to Embodiment 5. This contributes to achievement of a higher-speed writing. In addition, a write operation can be performed with a simple step.

Since a voltage which is as low as 2 to 3V is sufficient as the write voltage, low electric power consumption can be realized.

In this embodiment, redundant relief memory cells and memory cells for parity bits for error correction may be provided additionally. In that case, as these memory cells, the nonvolatile memory elements of the present invention may be used.

(Embodiment 6)

A nonvolatile semiconductor apparatus according to Embodiment 6 is a nonvolatile semiconductor apparatus which includes the nonvolatile memory element according to any one of Embodiment 1 to Embodiment 3 having a programming function, and a logic circuit for executing predetermined calculation.

[Configuration of Nonvolatile Semiconductor Apparatus]

Figure 28:
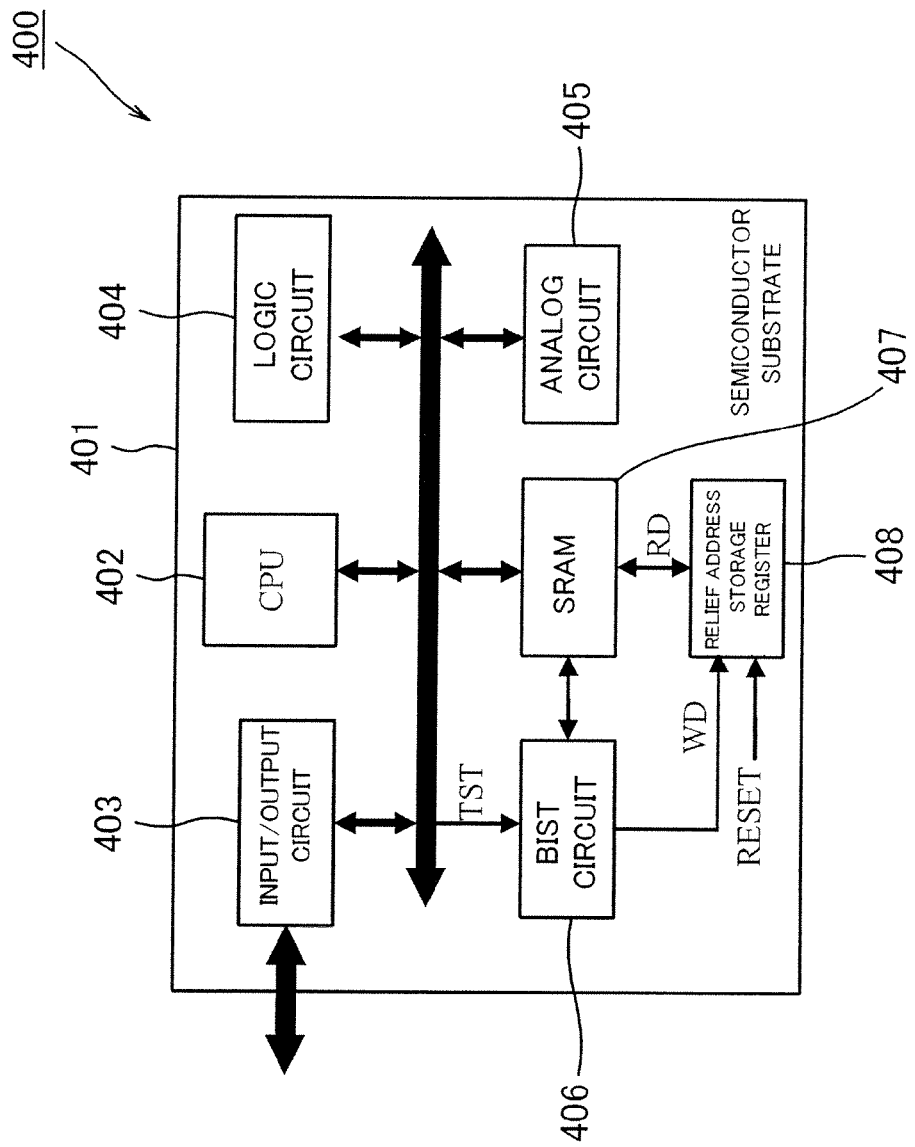
FIG. 28 is a block diagram showing a configuration of a nonvolatile semiconductor apparatus according to Embodiment 6 of the present invention.

FIG. 28 is a block diagram showing a configuration of a nonvolatile semiconductor apparatus according to Embodiment 6 of the present invention.

As shown in FIG. 28, a nonvolatile semiconductor apparatus 400 according to this embodiment includes, on a semiconductor substrate 401, a CPU 402, an input/output circuit 403 for inputting/outputting data to/from an external circuit, a logic circuit 404 for executing predetermined calculation, an analog circuit 405 for processing an analog signal, a BIST (Built In Self Test) circuit 406 for performing self diagnosis, a SRAM 407, and a relief address storage register 408 which is connected to the BIST circuit 406 and to the SRAM 407 and is configured to store specific address data.

Figure 29:
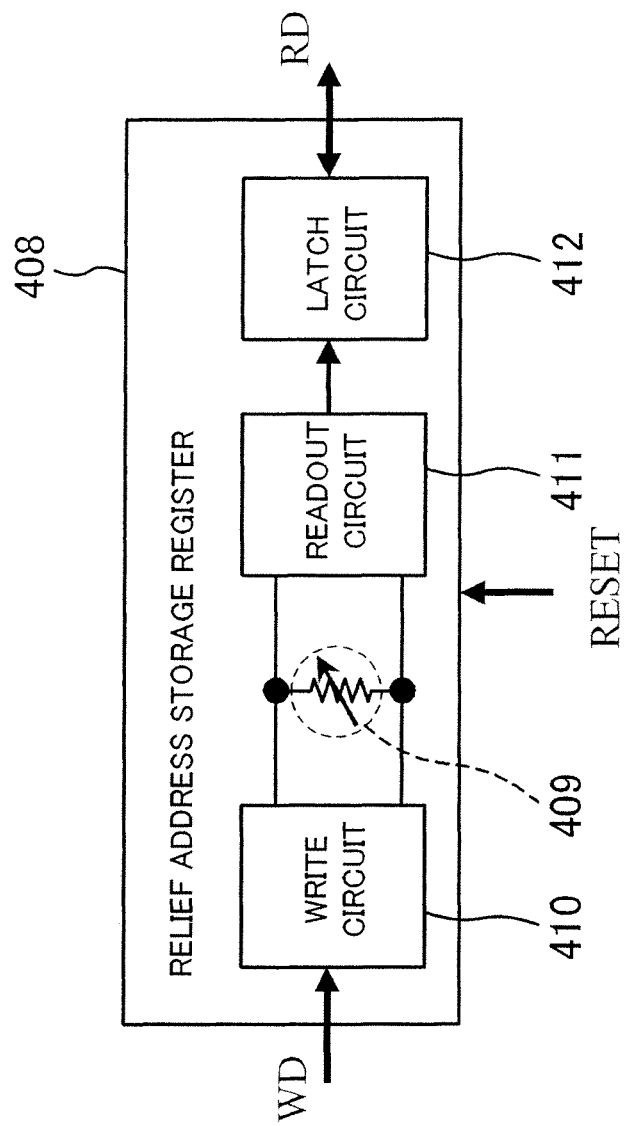
FIG. 29 is a block diagram showing a configuration of a relief address storage register included in the nonvolatile semiconductor apparatus according to Embodiment 6 of the present invention.
Figure 30:
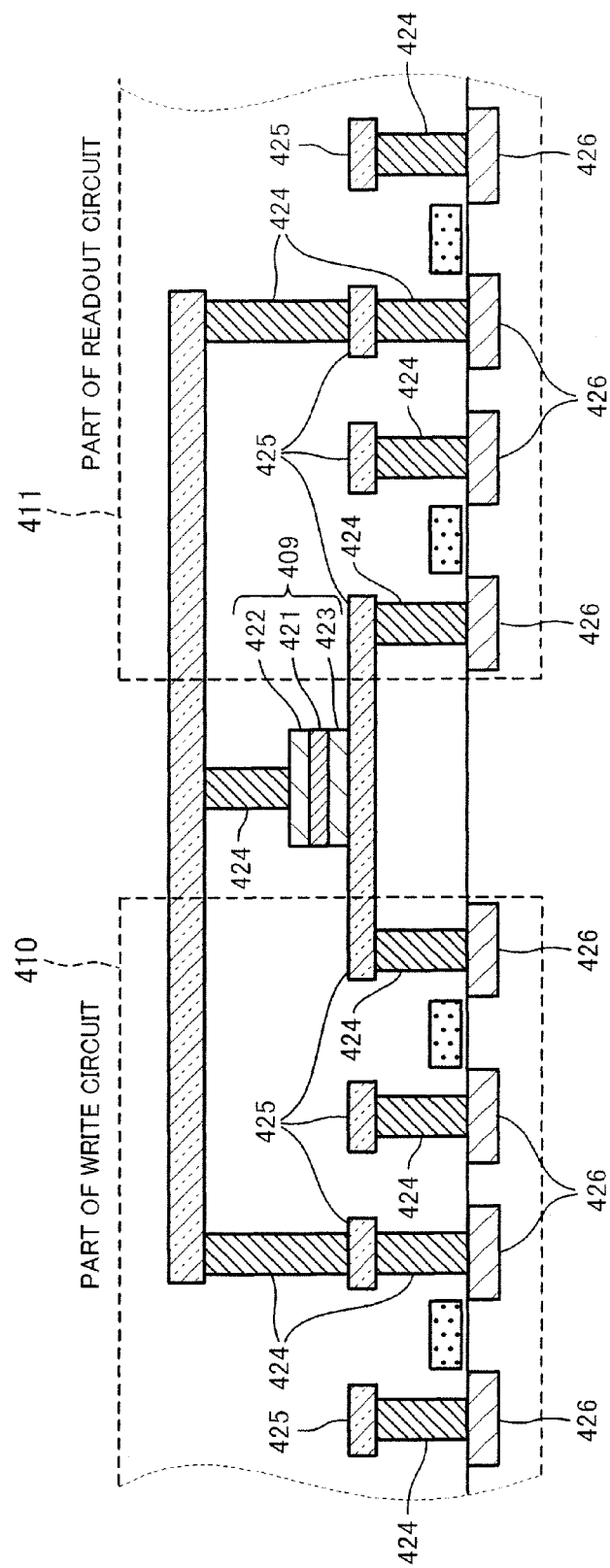
FIG. 30 is a cross-sectional view showing a configuration of the relief address storage register included in the nonvolatile semiconductor apparatus according to Embodiment 6 of the present invention.

FIG. 29 is a block diagram showing a configuration of a relief address storage register included in the nonvolatile semiconductor apparatus according to Embodiment 6 of the present invention. FIG. 30 is a cross-sectional view showing a configuration of the relief address storage register.

As shown in FIGS. 29 and 30, the relief address storage register 408 includes a nonvolatile memory element 409 corresponding to the nonvolatile memory elements according to Embodiment 1 to Embodiment 3, a write circuit 410 for writing specific address data to the nonvolatile memory element 409, a readout circuit 411 for reading out the address data written in the nonvolatile memory element 409, and a latch circuit 412.

The nonvolatile memory element 409 is connected to a switch portion to the write circuit 410 side and a switch portion to the readout circuit 411 side, and has a structure in which the resistance variable layer 421 is sandwiched between the upper electrode 422 and the lower electrode 423. The nonvolatile memory element 409 corresponds to the nonvolatile memory elements according to Embodiment 1 to Embodiment 3.

In FIG. 30, 424 denotes a plug layer, 425 denotes a metal wire layer, and 426 denotes a source/drain layer.

Whereas in this embodiment, two-layer wires are provided and the nonvolatile memory element is provided between the first wire and the second wire, multi-layer wires of three or more layers may alternately be provided and the nonvolatile memory element may be disposed between desired wires. In further alternative, the nonvolatile memory element may be disposed between a plurality of wires as desired.

[Example of Operation of Nonvolatile Semiconductor Apparatus]

Subsequently, an example of the operation of the nonvolatile semiconductor apparatus according to this embodiment configured as described above will be described.

Hereinafter, a case where the address data is written to the relief address storage register 408 will be described. The BIST circuit 406 inspects a memory block in the SRAM 407, when receiving a diagnosis command signal TST.

The memory block is inspected during inspection in a manufacturing process of LSI, and during various diagnostic processes carried out in the case where the LSI is mounted to an actual system.

If a faulty bit is detected as a result of inspection of the memory block, the BIST circuit 406 outputs write data command signal WD to the relief address storage register 408. Receiving the write data command signal WD, the relief address storage register 408 stores address data corresponding to the faulty bit therein.

The address data is stored by changing the resistance state of the resistance variable layer in the associated register to the high-resistance state or to the low-resistance state, according to the address data. The resistance variable layer is changed to the high-resistance state or to the low-resistance state as in Embodiment 1 to Embodiment 3.

In this way, the address data is written to the relief address storage register 408. Upon the SRAM 407 being accessed, the address data written in the relief address storage register 408 is read out. The address data is read out by detecting an output current value corresponding to the resistance state of the resistance variable layer as in Embodiment 1 to Embodiment 3.

When the address data read out from the relief address storage register 408 matches the address data of an access target, a backup redundant memory cell provided in the SRAM 407 is accessed, so that data is read out or written.

The self diagnosis performed as described above eliminates a need for an expensive LSI tester provided externally, in inspection in the manufacturing process. In addition, the self diagnosis makes it possible to advantageously conduct at Speed test. Furthermore, since faulty bits can be relieved after a lapse of time as well as in the inspection, a high quality can be advantageously kept for a long period of time.

The nonvolatile semiconductor apparatus according to this embodiment is applicable to a case where data is written only once in the manufacturing process and to a case where data is rewritten repeatedly after shipment of products.

[Method of Manufacturing Nonvolatile Semiconductor Apparatus]

Subsequently, a manufacturing method of the nonvolatile semiconductor apparatus according to this embodiment configured as described above will be described.

Figure 31:
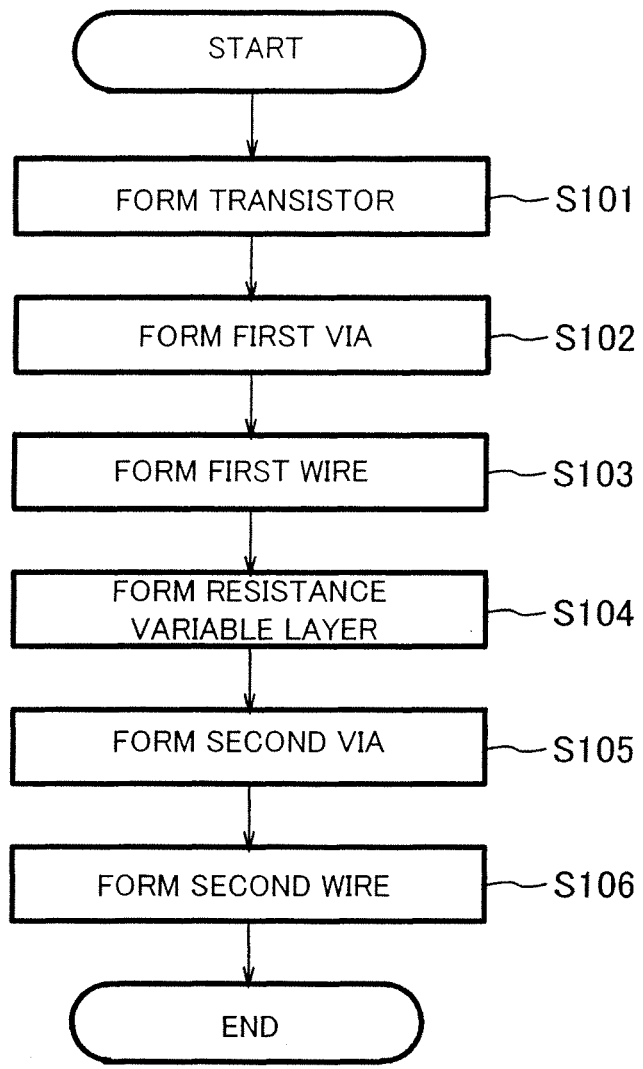
FIG. 31 is a flowchart showing a main flow of a process for manufacturing the nonvolatile semiconductor apparatus according to Embodiment 6 of the present invention.
Figure 32:
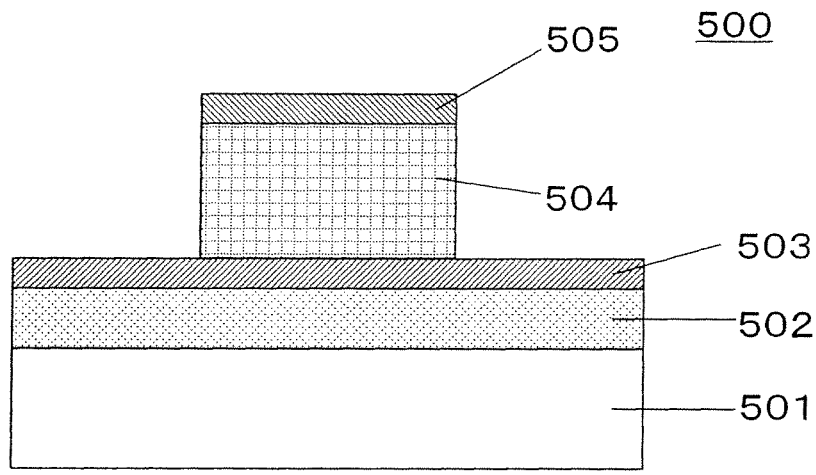
FIG. 32 is a cross-sectional view showing a configuration of the conventional memory element.

FIG. 31 is a flowchart showing a main flow of a manufacturing process of the nonvolatile semiconductor apparatus according to Embodiment 6 of the present invention.

Initially, a transistor is formed on the semiconductor substrate (S101). Then, a first via is formed (S102), and a first wire is formed thereon (S103).

Then, the resistance variable layer is formed on the first wire formed in S103 (S104). The resistance variable layer is formed as described in Embodiment 1 and Embodiment 2.

Then, a second via is formed on the resistance variable layer (S105), and further, a second wire is formed thereon (S106).

As described above, the manufacturing method of the nonvolatile semiconductor apparatus of this embodiment is such that the step of forming the electrodes and the resistance variable layer is added to the manufacturing process of the CMOS process. Therefore, the nonvolatile semiconductor apparatus can be easily manufactured by utilizing the existing CMOS process. In addition, since additional steps are fewer and the film thickness of the resistance variable layer is relatively small, the time of the process can be shortened.

As in Embodiment 3, the resistance variable layer of the present invention can be formed at a low temperature. Therefore, it is advantageous that transistors or wire material such as silicide formed in a lower layer step are not affected even when forming a layered structure is performed in a wiring step illustrated in this embodiment.

Since the electrode portion can be formed with 1 μm square or smaller and other circuits can be formed in the CMOS process, a small-sized nonvolatile switch circuit can be easily attained.

Instead of using, as in this embodiment, the nonvolatile memory element including the resistance variable layer comprising tantalum oxide in Embodiment 1 to Embodiment 3, the nonvolatile semiconductor apparatus might be attained by using a known flash memory nonvolatile memory element or a known FeRAM memory nonvolatile memory element. In these cases, however, a special process step and material become necessary, which makes it difficult that these memory elements have affinity with the CMOS process. For this reason, a cost problem arises, and the manufacturing steps significantly increases, which is not practical. Further, a problem arises, that these memory elements are difficult to use as the programming element, because writing and reading out of data are complicated in these memory elements.

As a configuration which has high affinity with the CMOS process, there is provided a memory cell called a CMOS nonvolatile memory cell, which operates equivalently to the flash memory cell by floating the gate wires in the CMOS process. However, such a configuration arises problems that area of the element portion increases and control of its operation is complicated.

The configuration using an electric fuse element such as a silicide fusing element may have high affinity with the CMOS process. In this case, problems that rewrite of the data cannot be performed, and area of the electrode portion increases arise.

The wires may be trimmed by a known laser. In this case, miniaturization is constrained by a mechanical precision of a laser trimmer, which is limited only in a manufacturing process, and therefore cannot be realized. Or, there is a limitation on layout, because the wires must be positioned as an uppermost layer.

Whereas the nonvolatile memory elements in Embodiment 1 and Embodiment 2 are used as the relief address storage register of the SRAM, the following examples may be alternatively used. For example, the nonvolatile memory elements in Embodiment 3 to Embodiment 4 may be used as the relief address storage register for faulty bits in DRAM, ROM, or the nonvolatile semiconductor apparatuses according to Embodiment 1 and Embodiment 4.

The nonvolatile memory element may be applied to a nonvolatile switch for switching a faulty logic circuit or a backup logic circuit. Furthermore, the nonvolatile memory element may be used as a register for adjusting a voltage in an analog circuit and for adjusting timing in the analog circuit, a register for modifying a ROM which is a product, a nonvolatile switch element for reconfigurable logic and EPGA, and a nonvolatile register.

(Other Embodiment)

The nonvolatile semiconductor apparatus according to Embodiment 6 may be configured to include the nonvolatile semiconductor apparatus according to Embodiment 4, that is, to integrate on one semiconductor substrate, the cross-point type nonvolatile semiconductor apparatus according to Embodiment 4 and the LSI having the CPU according to Embodiment 6.

In this case, the cross-point type nonvolatile semiconductor apparatus according to Embodiment 4 and the LSI having the CPU according to Embodiment 6 are formed on different semiconductor substrates, and thereafter may be molded into one package.

The nonvolatile semiconductor apparatus according to Embodiment 6 may be configured to include the nonvolatile semiconductor apparatus according to Embodiment 5, that is, to integrate on one semiconductor substrate the nonvolatile semiconductor apparatus having the one transistor/one nonvolatile memory portion configuration according to Embodiment 5 and the LSI having the CPU according to Embodiment 6.

In this case, also, the nonvolatile semiconductor apparatus having the one transistor/one nonvolatile memory portion configuration according to Embodiment 5 and the LSI having the CPU according to Embodiment 6 are formed on different semiconductor substrates, and thereafter may be molded into one package.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the sprit of the invention.

INDUSTRIAL APPLICABILITY

A nonvolatile memory element and a nonvolatile semiconductor apparatus of the present invention are capable of high-speed operation, have a stable rewrite characteristic, and are useful as nonvolatile memory elements and others which are used in various electronic devices such as digital home electric appliances, memory cards, cellular phones, and personal computers.

A manufacturing method of the nonvolatile memory element of the present invention is useful as a manufacturing method of the nonvolatile memory elements and others which are capable of high-speed operation, have a stable rewrite characteristic, and are used in various electronic devices.

The invention claimed is:

1. A method of manufacturing a nonvolatile memory element including a first electrode; a second electrode; and a resistance variable layer which is disposed between the first electrode and the second electrode, a resistance value of the resistance variable layer varying reversibly according to electric signals which are applied between the first electrode and the second electrode, said method comprising:

forming a first oxygen-deficient tantalum oxide layer having a composition represented by TaOx, where $0.8 \leq x \leq 1.9$; and exposing a surface of the first oxygen-deficient tantalum oxide layer to oxygen plasma so as to form a second oxygen-deficient tantalum oxide layer having a composition represented by TaOy, where $2.1 \leq y < 2.5$, on the first oxygen-deficient tantalum oxide layer.

2. The method of manufacturing a nonvolatile memory element according to claim 1, wherein a thickness of the second oxygen-deficient tantalum oxide layer is changed according to an amount of time the surface of the first oxygen-deficient tantalum oxide layer is exposed to the oxygen plasma.

3. The method of manufacturing a nonvolatile memory element according to claim 1, wherein the resistance value of the resistance variable layer in the nonvolatile memory element reversibly varies according to electric signals having different polarities which are applied between the first electrode and the second electrode.

4. The method of manufacturing a nonvolatile memory element according to claim 1, wherein the first oxygen-deficient tantalum oxide layer is deposited by a sputtering method or a chemical vapor deposition method.

* * * * *